United States Patent
Lue et al.

(10) Patent No.: US 11,825,653 B2
(45) Date of Patent: Nov. 21, 2023

(54) SEMICONDUCTOR DEVICE AND ARRAY LAYOUT THEREOF AND PACKAGE STRUCTURE COMPRISING THE SAME

(71) Applicant: MACRONIX INTERNATIONAL CO., LTD., Hsinchu (TW)

(72) Inventors: Hang-Ting Lue, Hsinchu (TW); Wei-Chen Chen, Taoyuan County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 607 days.

(21) Appl. No.: 16/923,144

(22) Filed: Jul. 8, 2020

(65) Prior Publication Data

US 2021/0193677 A1   Jun. 24, 2021

Related U.S. Application Data

(60) Provisional application No. 62/952,501, filed on Dec. 23, 2019.

(51) Int. Cl.
| | |
|---|---|
| *H10B 43/27* | (2023.01) |
| *H01L 29/06* | (2006.01) |
| *H01L 29/423* | (2006.01) |
| *H10B 43/10* | (2023.01) |
| *H10B 43/30* | (2023.01) |
| *H10B 51/10* | (2023.01) |
| *H10B 51/20* | (2023.01) |
| *H10B 51/30* | (2023.01) |

(52) U.S. Cl.
CPC ......... *H10B 43/27* (2023.02); *H01L 29/0649* (2013.01); *H01L 29/42344* (2013.01); *H10B 43/10* (2023.02); *H10B 43/30* (2023.02); *H10B 51/10* (2023.02); *H10B 51/20* (2023.02); *H10B 51/30* (2023.02)

(58) Field of Classification Search
CPC ... H01L 27/11582; H10B 43/10; H10B 41/20; H10B 41/27; H10B 43/27; G11C 16/0483
See application file for complete search history.

(56) References Cited

U.S. PATENT DOCUMENTS

2020/0357821 A1* 11/2020 Chen ............... H10B 51/20

* cited by examiner

*Primary Examiner* — Selim U Ahmed
(74) *Attorney, Agent, or Firm* — McClure, Qualey & Rodack, LLP

(57) ABSTRACT

A semiconductor device includes a stack formed on a substrate and memory strings penetrating the stack along a first direction. The stack includes conductive layers and insulating layers that alternately stacked. Each of the memory strings includes a channel layer, a memory structure, a first conductive pillar and a second conductive pillar. The channel layer, the first conductive pillar and the second conductive pillar extend along a first direction. The memory structure is disposed between the stack and the channel layer. The first conductive pillar and the second conductive pillar are electrically isolated from each other, and are respectively coupled to a first portion and a second portion of the channel layer. The first portion is opposite to the second portion. The first portion is surrounded by the memory structure, and the second portion is exposed from the memory structure.

19 Claims, 37 Drawing Sheets

SEMICONDUCTOR DEVICE AND ARRAY LAYOUT THEREOF AND PACKAGE STRUCTURE COMPRISING THE SAME

This application claims the benefit of U.S. provisional application Ser. No. 62/952,501, filed Dec. 23, 2019, the subject matter of which is incorporated herein by reference.

BACKGROUND OF THE INVENTION

Field of the Invention

The invention relates in general to a semiconductor device and an array layout thereof and a package structure comprising the same, and more particularly to a three dimensional semiconductor device and an array layout thereof and a package structure comprising the same.

Description of the Related Art

Recently, as a non-volatile memory has the advantage that the stored data will not disappear when the power is turned off, people's demand for it is increasing.

However, the non-volatile memory (such as flash memory) may cause the problem of over erasing due to the lower threshold voltage, thereby forming a leakage current. Therefore, there is still an urgent need to develop an improved non-volatile memory to solve the above problems.

SUMMARY OF THE INVENTION

The invention is directed to a semiconductor device, wherein the channel layer has a first location and a second location opposite to the first location. In comparison with the comparative example where both the first location and the second location are surrounded by the memory structure, since the first location is surrounded by the memory structure and the second location is exposed from the memory structure, the current can be turned off more completely to avoid the problem of over erasing.

According to an aspect of the present invention, a semiconductor device is provided. The semiconductor device includes a stack and a plurality of memory strings. The stack is formed on a substrate, and the stack includes a plurality of conductive layers and a plurality of insulating layers alternately stacked with the conductive layers. The memory strings penetrate the stack along a first direction, and each of the memory strings includes a channel layer, a memory structure, a first conductive pillar and a second conductive pillar. The channel layer extends in the first direction. The memory structure is disposed between the stack and the channel layer. The first conductive pillar and the second conductive pillar extend along the first direction and are electrically isolated from each other, and are respectively coupled to a first location and a second location of the channel layer. The first location is opposite to the second location. The first location is surrounded by the memory structure, and the second location is exposed from the memory structure. In the memory array, the memory strings are disposed into a plurality rows of memory strings along a third direction, and adjacent rows of the memory strings have an offset distance in the third direction, and the first locations of two adjacent rows of the memory strings are adjacent to each other.

According to another aspect of the present invention, an array layout of the semiconductor device is provided. The array layout of the semiconductor device includes a stack and a plurality of memory strings. The stack is formed on a substrate, and the stack includes a plurality of conductive layers and a plurality of insulating layers alternately stacked with the conductive layers. The memory strings penetrate the stack along a first direction, and are disposed on the substrate along a second direction and a third direction to become a memory array. The first direction, the second direction and the third direction are perpendicular to each other. Each of the memory strings includes a channel layer, a memory structure, a first conductive pillar and a second conductive pillar. The channel layer extends in the first direction. The memory structure is disposed between the stack and the channel layer. The first conductive pillar and the second conductive pillar extend along the first direction and are electrically isolated from each other, and are respectively coupled to a first location and a second location of the channel layer. The first location is opposite to the second location. The first location is surrounded by the memory structure, and the second location is exposed from the memory structure.

According to a further aspect of the present invention, a package structure is provided. The package structure includes a memory chip and a memory control chip. The memory chip includes a semiconductor device as described herein. The memory control chip is used to control the memory chip. The memory chip is disposed on the memory control chip.

The above and other aspects of the invention will become better understood with regard to the following detailed description of the preferred but non-limiting embodiment(s). The following description is made with reference to the accompanying drawings.

DETAILED DESCRIPTION OF THE INVENTION

FIG. 1A to FIG. 8B are schematic diagrams illustrating a manufacturing process of a semiconductor device 100 according to an embodiment of the present invention. FIGS. 1A, 2A, 3A, 4A, 5A, 6A, 7A, and 8A show the plane formed by the X-axis and the Y-axis, and FIGS. 1B, 2B, 3B, 4B, 5B, 6B, 7B, and 8B show the plane formed by the X-axis and the Z-axis.

Figure 1A:
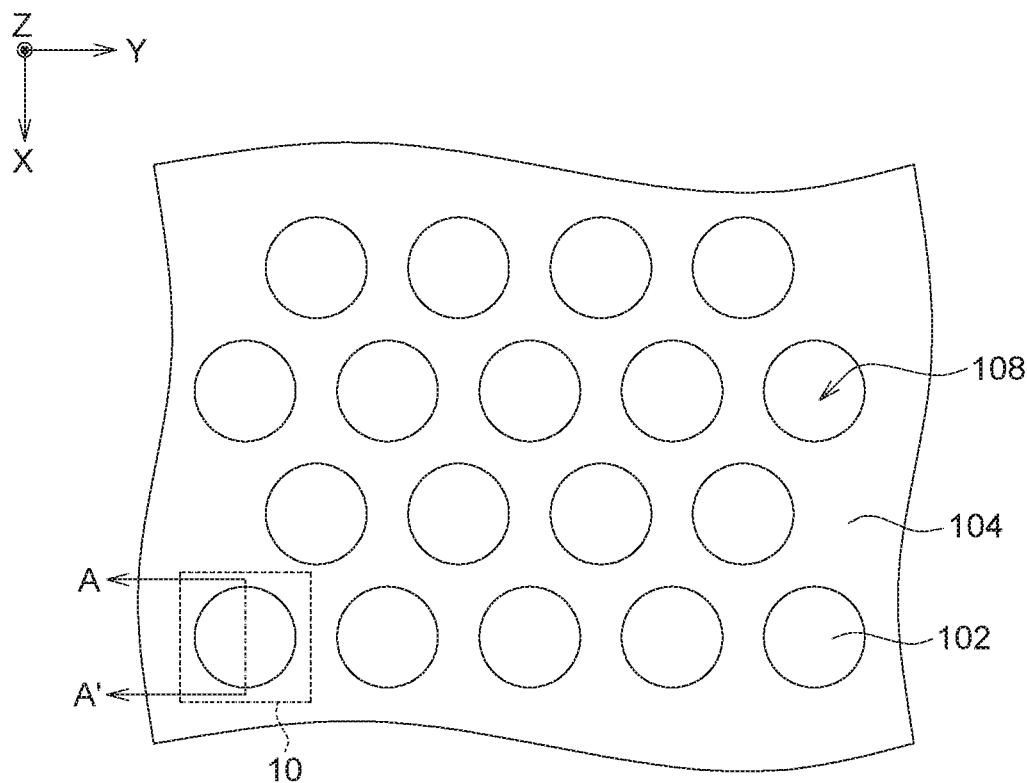
FIG. 1A to FIG. 8B are schematic diagrams illustrating a manufacturing process of a semiconductor device according to an embodiment of the present invention.
Figure 1B:
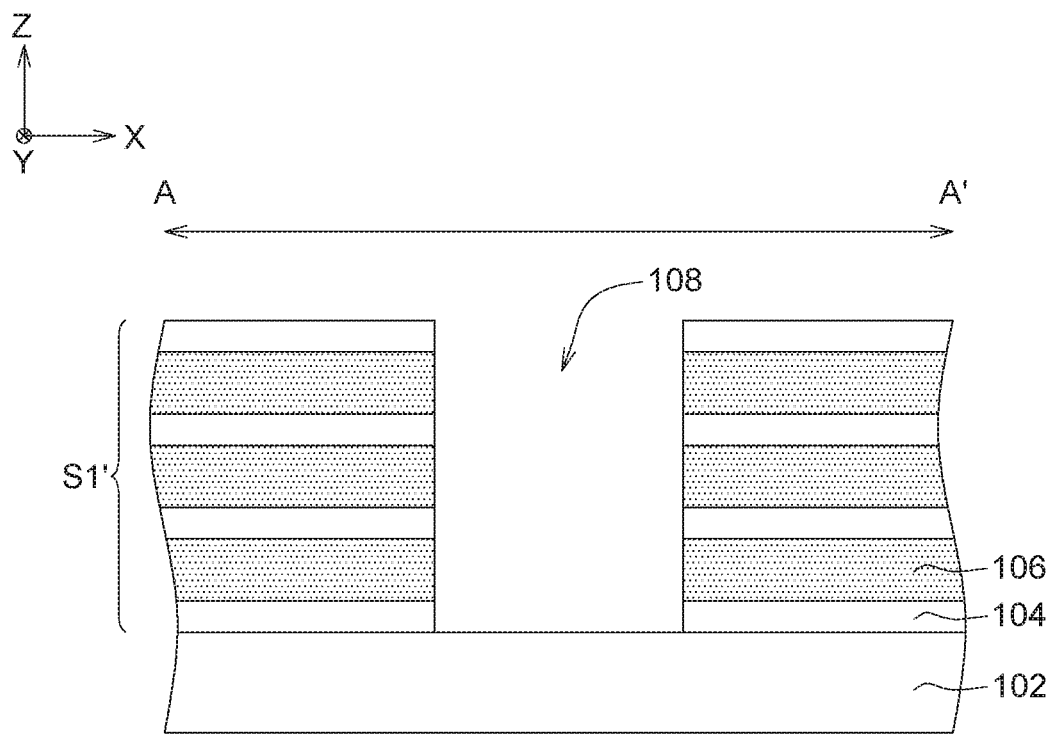

FIG. 1A illustrates a top view after the openings 108 are formed. FIG. 1B is a cross-sectional view taken along the line A-A' in FIG. 1A, that is, a corresponding area 10 of one of the memory strings is represented, and the subsequent process steps are all based on the corresponding area 10.

Referring to FIGS. 1A and 1B at the same time, a substrate 102 is provided, and a stack S1' is formed on the substrate 102. The stack S1' includes a plurality of sacrificial layers 106 and a plurality of insulating layers 104 alternately stacked with the sacrificial layers 106 along a first direction (for example, the Z direction or a normal direction of an upper surface of the substrate 102). Thereafter, a plurality of openings 108 penetrating the stack S1' along the first direction (e.g., the Z direction) are formed by an etching process. The bottom of each of the openings 108 exposes a portion of the upper surface of the substrate 102. In the present embodiment, the opening 108 has a circular cross section in the top view of FIG. 1A, but the present invention is not limited thereto. The cross section of the opening 108 in the top view of FIG. 1A may be oval or other suitable geometry.

In some embodiments, the substrate 102 is, for example, a dielectric layer (such as a silicon oxide layer). The insulating layer 104 may be, for example, a silicon oxide layer, and the silicon oxide layer may include silicon dioxide, for example. The sacrificial layer 106 may be, for example, a silicon nitride layer. In the present embodiment, the topmost and bottommost layers of the stack S1' are the insulating layers 104, and four insulating layers 104 and three sacrificial layers 106 are shown. However, the present invention is not limited thereto. The number and configuration of the insulating layers 104 and the sacrificial layers 106 can be adjusted as required.

Figure 2A:
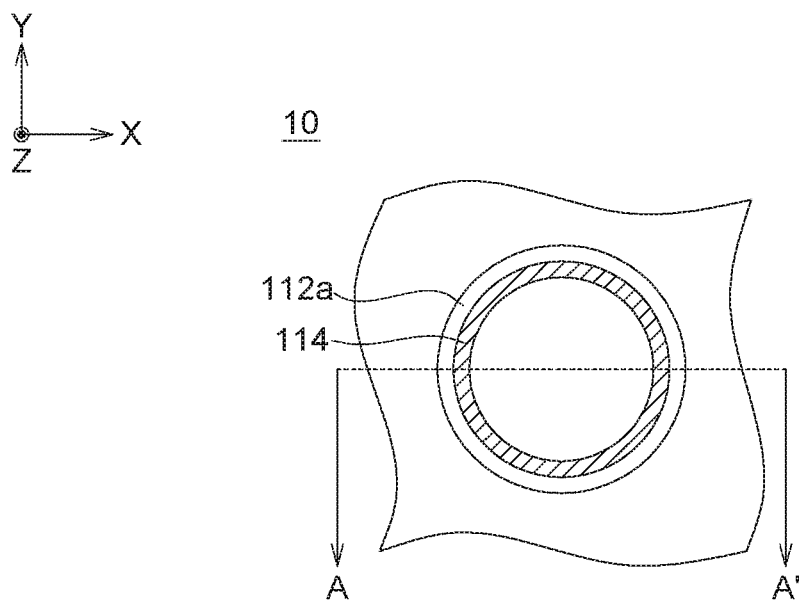
Figure 2B:
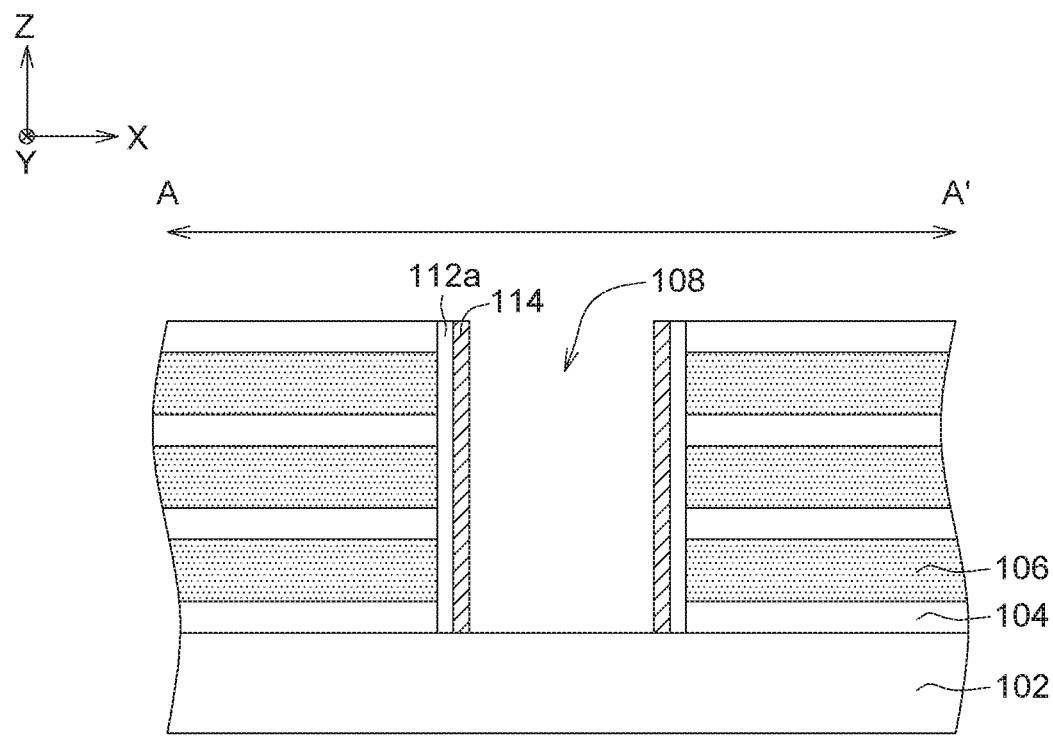

Thereafter, referring to FIGS. 2A and 2B simultaneously, a first oxide layer 112a and a nitride layer 114 are sequentially formed on the inner surface of each of the openings 108. For example, the first oxide 112a and the nitride layer 114 can be sequentially formed on the topmost insulating layer 104 and in the openings 108 by a deposition process, and then the excess first oxide layer 112a and the excess nitride layer 114 are removed by an etching process, to form a first oxide layer 112a and the nitride layer 114 disposed on the inner surface of each of the openings 108. The first oxide layer 112a is, for example, a silicon oxide layer (such as a silicon dioxide layer). The nitride layer 114 is, for example, a silicon nitride layer.

Figure 3A:
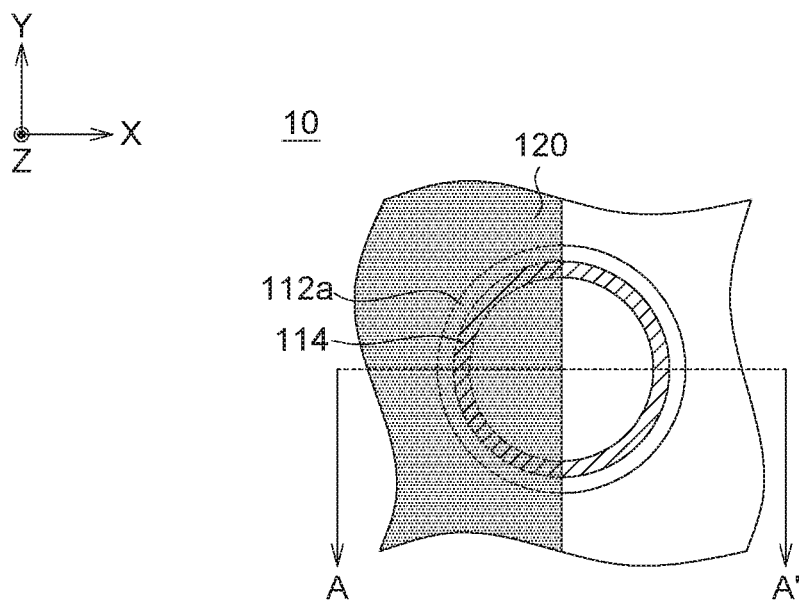
Figure 3B:
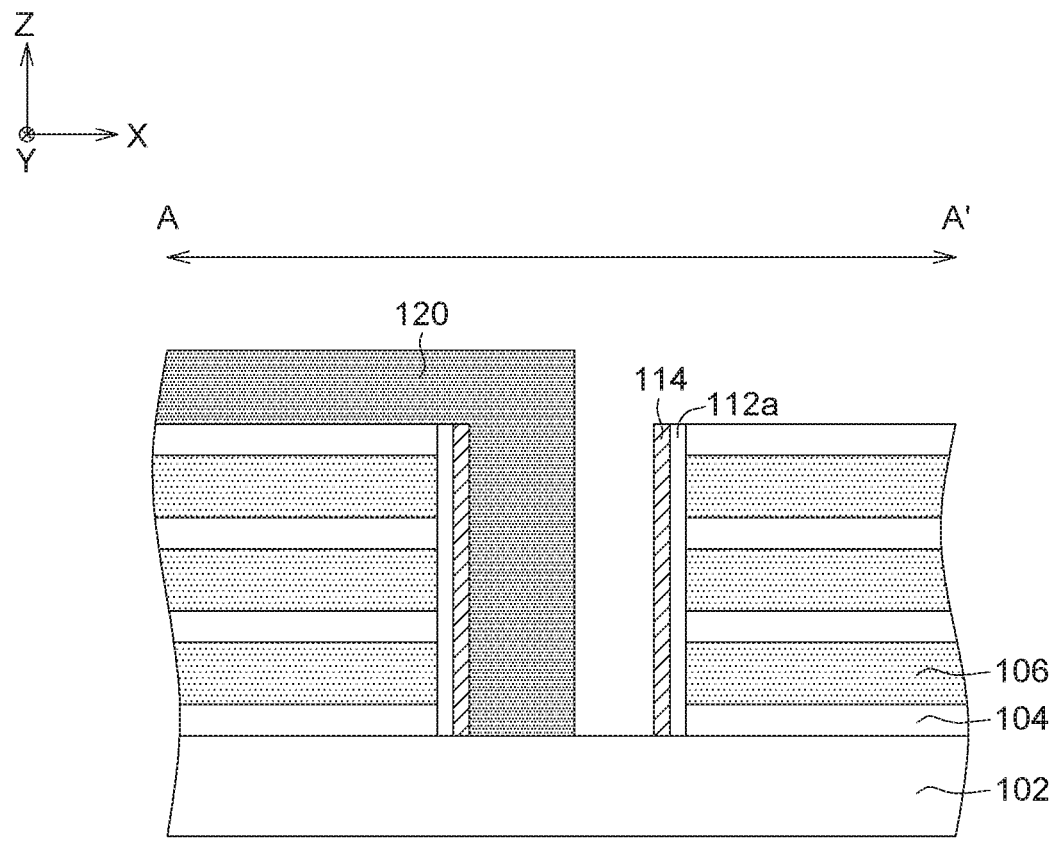

Next, referring to FIGS. 3A and 3B at the same time, an organic dielectric layer 120 is formed on the topmost insulating layer 104 and in the opening 108, and the organic dielectric layer 120 is patterned so that half of the opening 108 is covered by the organic dielectric layer 120, the other half of the opening 108 is exposed from the organic dielectric layer 120.

Figure 4A:
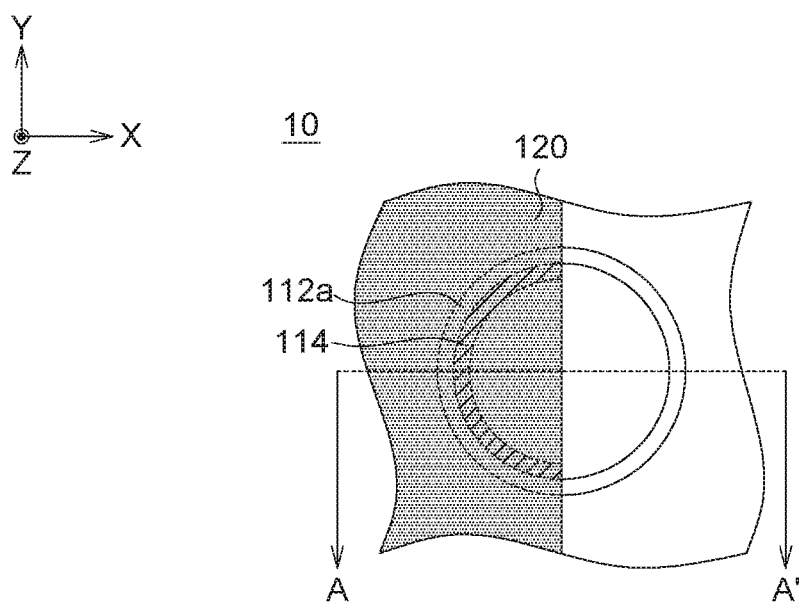
Figure 4B:
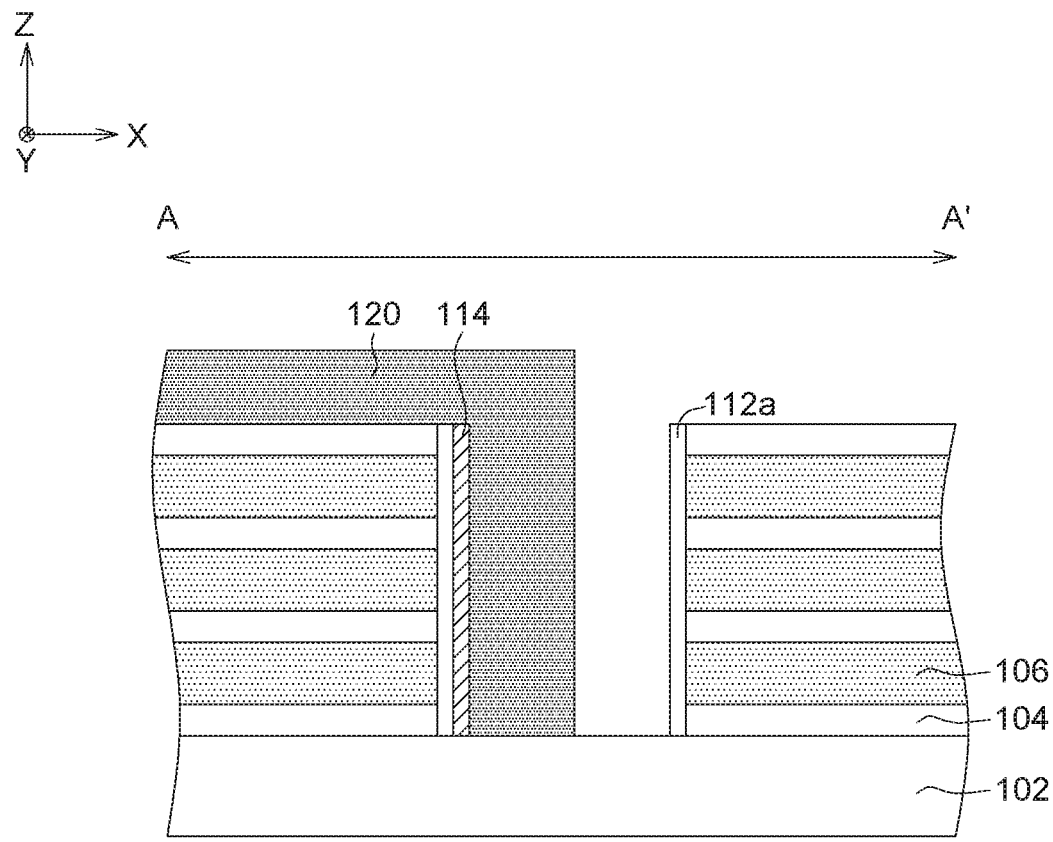

Referring to FIGS. 4A and 4B at the same time, the nitride layer 114 which is not protected by the organic dielectric layer 120 is removed by an etching process. This etching process is, for example, chemical dry etching, and half of the nitride layer 114 is selectively removed.

Figure 5A:
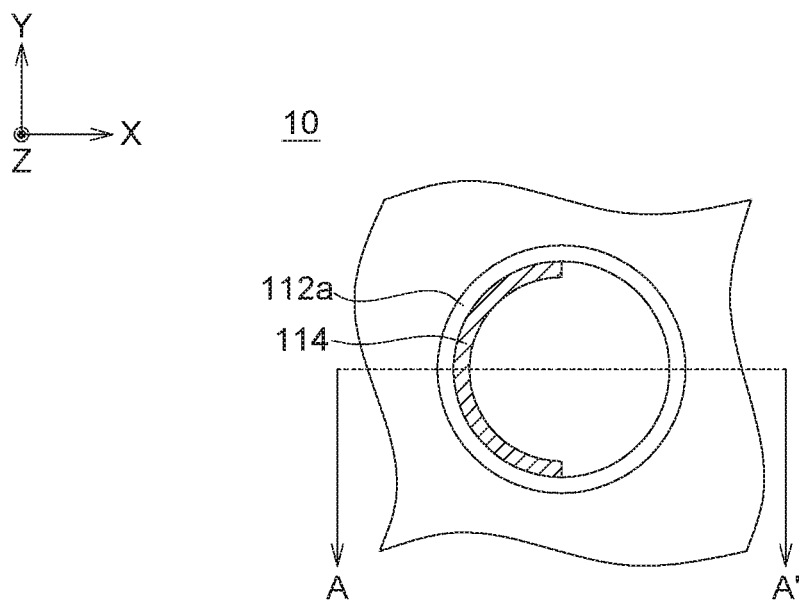
Figure 5B:
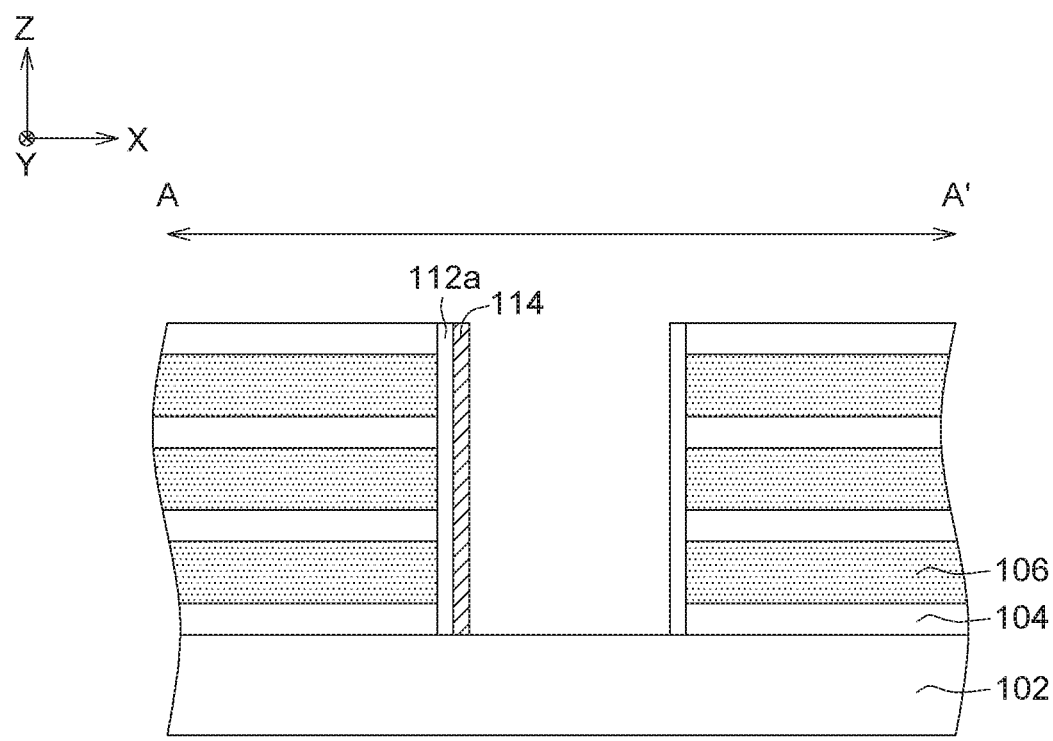

Referring to FIGS. 5A and 5B at the same time, the organic dielectric layer 120 is removed. In the present embodiment, the nitride layer 114 is substantially semi-circular in the top view, such as a U-shape and a C-shape, but the present invention is not limited thereto.

Figure 6A:
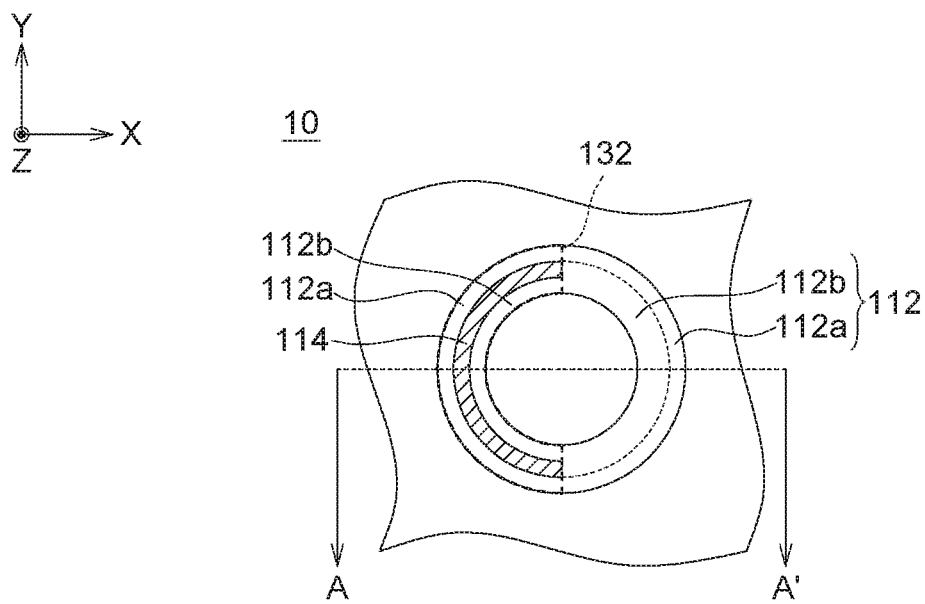
Figure 6B:
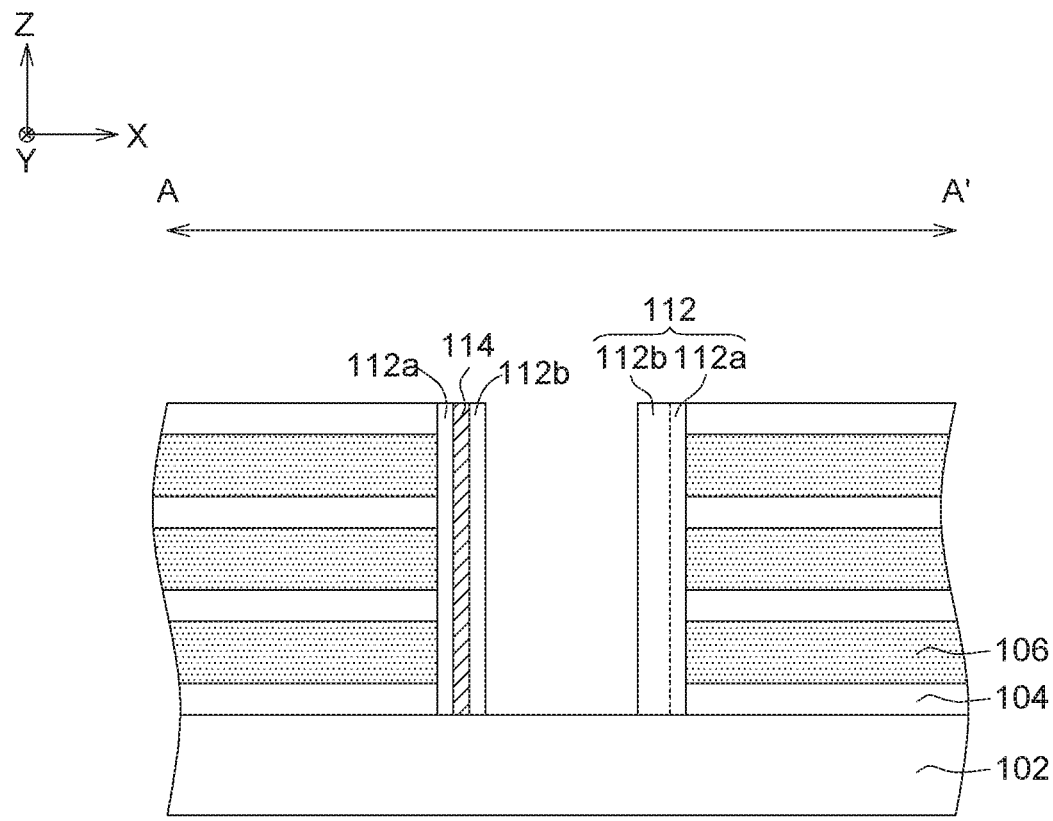

Referring to FIGS. 6A and 6B at the same time, a second oxide layer 112b is formed in the inner surface of the opening 108. Specifically, the inner surface of the nitride layer 114 is covered by the second oxide layer 112b in a first side of the opening 108 having the nitride layer 114; the inner surface of the first oxide layer 112a is covered by the second oxide layer 112b in a second side of the opening 108 without the nitride layer 114. In the opening 108, the first side is opposite the second side. The second oxide layer 112b may have the same material as the first oxide layer 112a. For example, the first oxide layer 112a and the second oxide layer 112b are silicon oxide layers (such as silicon dioxide layers). In the first side, a portion of the first oxide layer 112a, the nitride layer 114, and a portion of the second nitride layer 112b may form the memory structure 132; in the second side, the remaining portion of the first oxide layer 112a and the second oxide layer 112b may be formed together as the oxide layer 112.

Figure 7A:
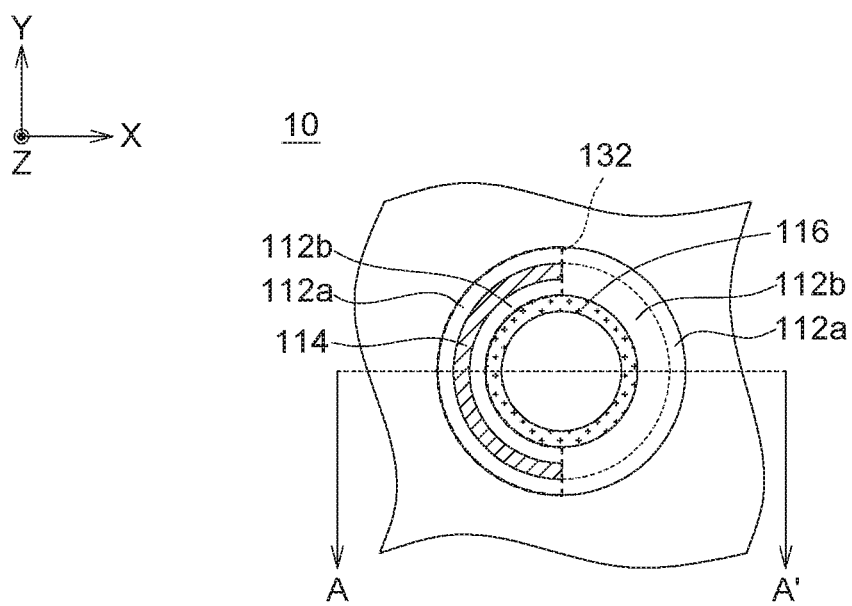
Figure 7B:
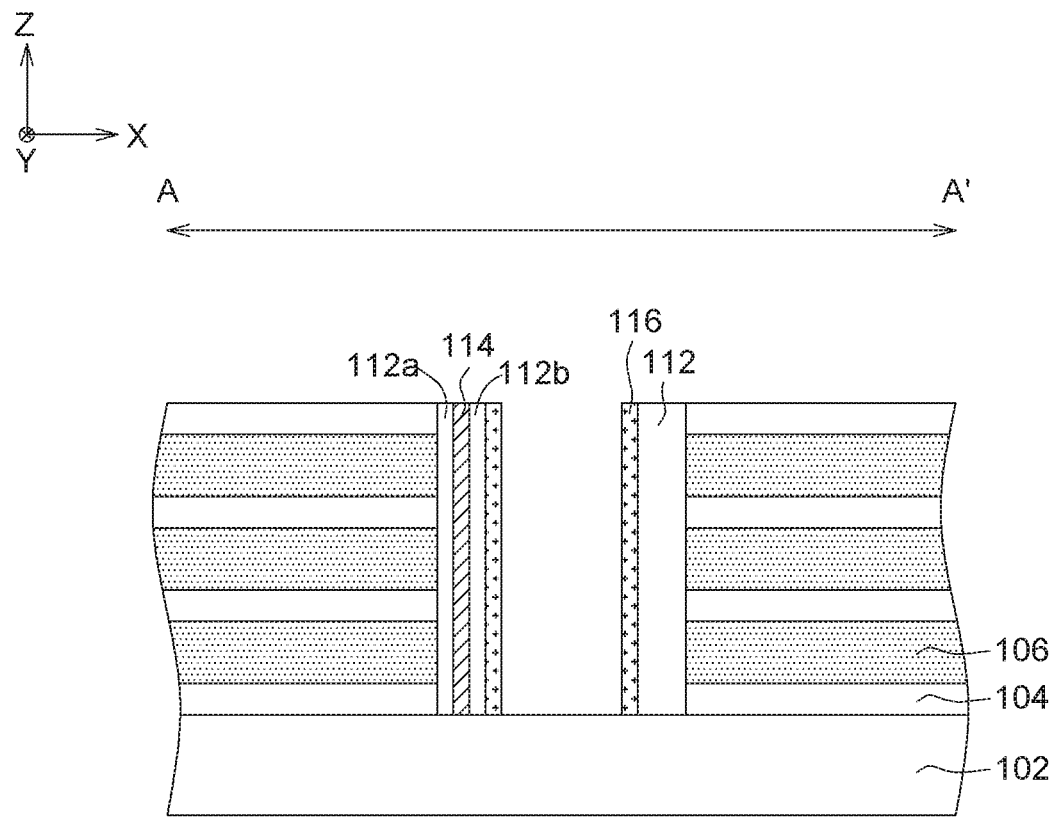

Referring to FIGS. 7A and 7B at the same time, a channel layer 116 is formed in the opening 108, that is, the channel layer 116 is formed on the inner surface of the second oxide layer 112b. The material of the channel layer 116 is, for example, un-doped polycrystalline silicon.

Figure 8A:
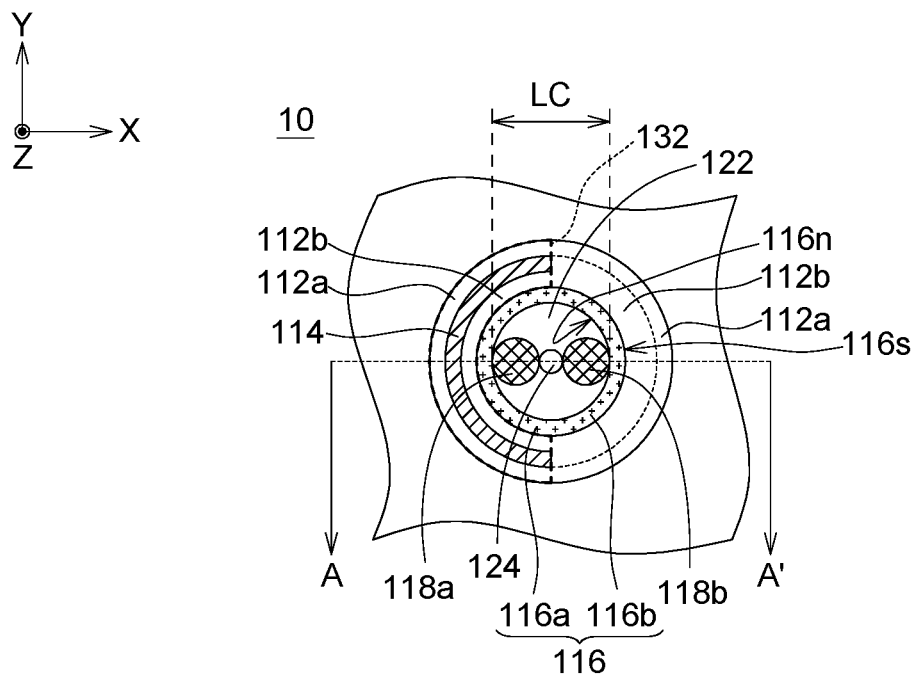
Figure 8B:
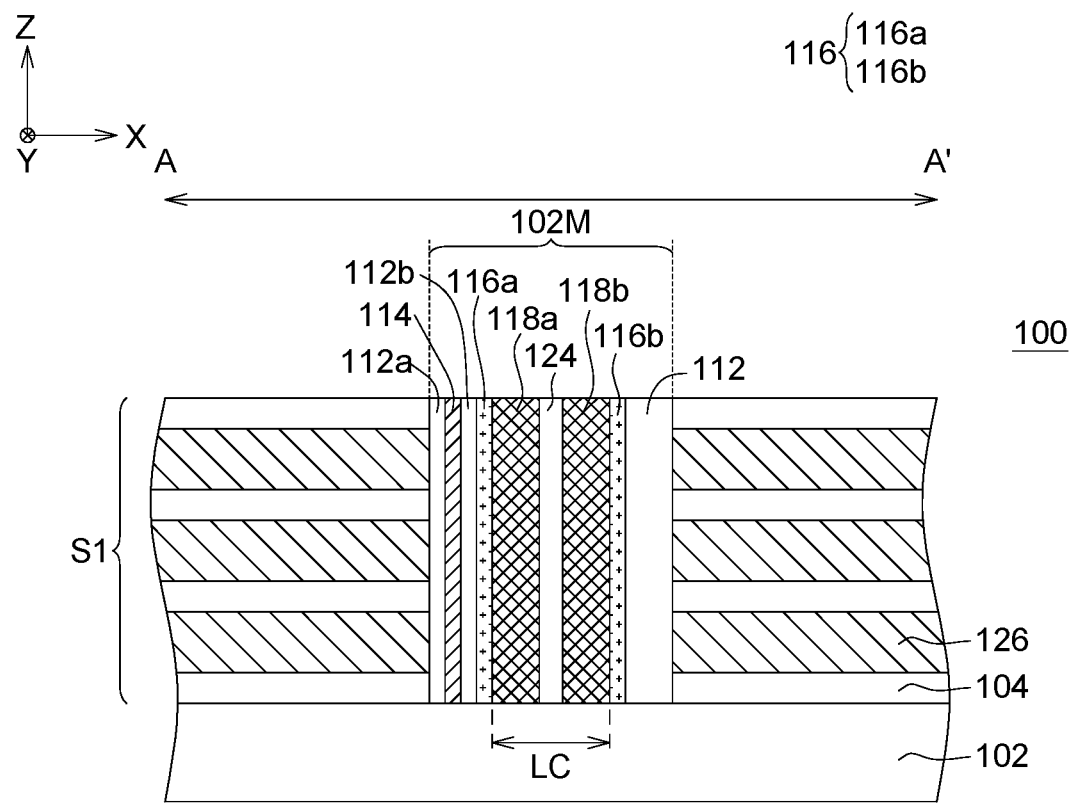

Thereafter, referring to FIGS. 8A and 8B at the same time, an insulating material layer 122 and an insulating pillar 124 are respectively filled in the openings 108 by a deposition process. The deposition process is, for example, a chemical vapor deposition process. The insulating material layer 122 is, for example, silicon oxide layer (for example, silicon dioxide layer). The material of the insulating pillar 124 includes, for example, silicon nitride. Thereafter, a first vertical opening and a second vertical opening exposing the upper surface of the substrate 102 are formed on two opposite sides of the insulating pillar 124 (that is, the first side and the second side of the above-mentioned opening 108) by an etching process. In other embodiments, the first vertical opening and the second vertical opening may penetrate a portion of the stack S1, but does not expose the upper surface of the substrate 102. The first vertical opening and the second vertical opening correspond to positions of a source and a drain of the memory of the semiconductor device 100 in the present embodiment. After the first vertical opening and the second vertical opening are enlarged to expose the insulating pillar 124 and the channel layer 116, a first conductive pillar 118a and a second conductive pillar 118b are formed in the first vertical opening and the second vertical opening, respectively. In other embodiments, the first vertical opening and the second vertical opening may be enlarged to a degree in which the insulating pillar 124 is not exposed. The material of the first conductive pillar 118a and the second conductive pillar 118b may include doped polycrystalline silicon.

Thereafter, an isolation trench (not shown) penetrating the stack S1' is formed, and the sacrificial layers 106 are removed from the isolation trench by an etching process, such as wet etching process, and then a conductive material is filled in the positions where the sacrificial layers 106 are removed, to form conductive layers 126 disposed between the insulating layers 104. The material of the conductive layers 126 is, for example, polycrystalline silicon, amorphous silicon, tungsten (W), cobalt (Co), aluminum (Al), tungsten silicide (WSiX), or cobalt silicide (CoSiX). In some embodiments, a buffer layer and a barrier layer (not shown) may be formed between the conductive layers 126 and the insulating layers 104. The buffer layer may be made of, for example, a material having a dielectric constant greater than 7, and the material having a dielectric constant greater than 7 is, for example, alumina ($Al_2O_3$), hafnium oxide ($HfO_2$), lanthanum oxide ($La_2O_5$), transition metal oxide, lanthanide oxides or arbitrary combinations thereof. The barrier layer may be made of, for example, titanium (Ti), titanium nitride (TiN), tantalum (Ta), tantalum nitride (TaN), or arbitrary combinations thereof. In this way, the semiconductor device 100 (as shown in FIG. 11) of the present embodiment can be completed.

Figure 11:
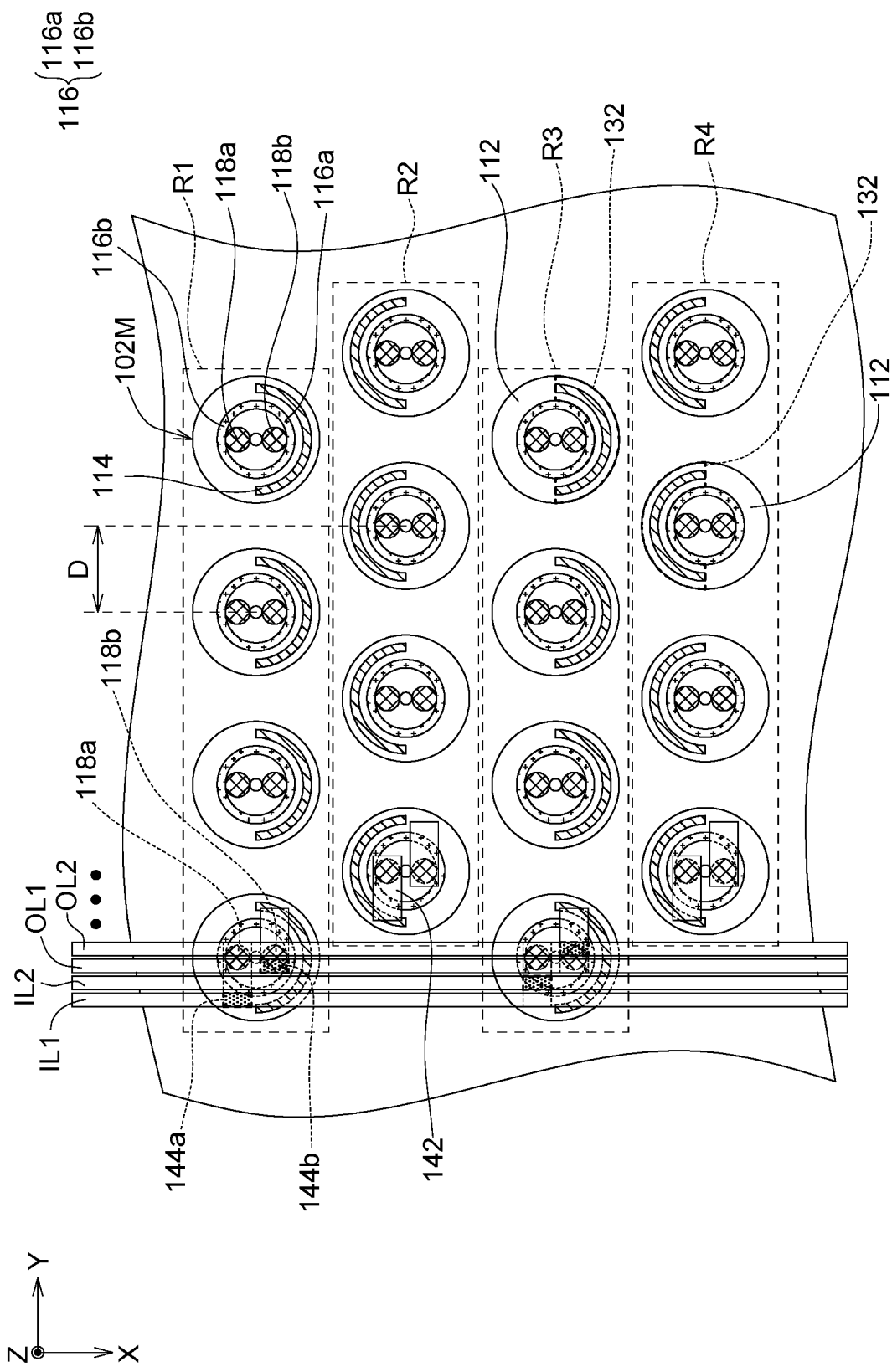
FIG. 11 is a top view of an array layout of a semiconductor device according to an embodiment of the present invention.

The semiconductor device 100 (as shown in FIG. 11) includes a stack S1 and a plurality of memory strings 102M. The stack S1 is formed on a substrate 102, and the stack S1 includes a plurality of conductive layers 126 and a plurality of insulating layers 104 alternately stacked with the conductive layers 126. The memory strings 102M penetrating the stack S1 along a first direction (for example, the Z direction). Each of the memory strings 102M includes a channel layer 116, a memory structure 132, an oxide layer 112, a first conductive pillar 118a, a second conductive pillar 118b, an insulating pillar 124, and an insulating material layer 122.

The channel layer 116, the memory structure 132, the first conductive pillar 118a, and the second conductive pillar 118b all extend along the first direction (for example, the Z direction). The memory structure 132 is disposed between the stack S1 and the channel layer 116. The memory structure 132 includes a portion of the first oxide layer 112a, the nitride layer 114, and a portion of the second oxide layer 112b. The insulating pillar 124 is disposed in a central area of the memory string 102M. The first conductive pillar 118a and the second conductive pillar 118b are connected to the insulating pillar 124. The first conductive pillar 118a and the second conductive pillar 118b are electrically isolated from each other by the insulating pillar 124, and are respectively coupled to a first location and a second location of the channel layer 116, and the first location is opposite to the second location, wherein the memory structure 132 surrounds the first location and exposes the second location. In other words, the memory structure 132 does not surround the second location and the second conductive pillar 118b, and a portion of the channel layer 116 surrounding the second location directly contacts the oxide layer 112. The channel layer 116 surrounds the first conductive pillar 118a, the second conductive pillar 118b, the insulating pillar 124, and the insulating material layer 122.

In the present embodiment, the first location and the second location are opposite to each other along a second direction (for example, the X direction), but the present invention is not limited thereto. The extending direction of the connection line between the first location and the second location (or the extending direction of the connection line LC between the first conductive pillar 118a and the second conductive pillar 118b) may be parallel to the second direction (for example, the X direction).

In the present embodiment, the memory structure 132 includes a charge storage material, such as a charge storage material formed by the first oxide layer 112a, the nitride layer 114, and the second oxide layer 112b, but the present invention is not limited thereto.

In some embodiments, the channel layer 116 has a circular cross section formed along a second direction (e.g., the X direction) and a third direction (e.g. the Y direction), and the second direction is perpendicular to the first direction. The channel layer 116 has an annular inner surface 116n and an annular outer surface 116s. The first conductive pillar 118a and the second conductive pillar 118b are coupled to the annular inner surface 116n. In the present embodiment, the annular inner surface 116n of the channel layer 116 is circular in the cross section formed along the second direction (for example, the X direction) and the third direction (for example, the Y direction), but the present invention is not limited thereto, and may be oval or other suitable shape.

In some embodiments, the memory structure 132 is substantially half-annular in a cross section formed along the second direction (for example, the X direction) and the third direction (for example, the Y direction), such as a U-shape or a C-shape. However, the present invention is not limited thereto. As long as the memory structure 132 is non-circular, in which it can surround the first location of the channel layer 116 (the location where the first conductive pillar 118a is coupled to the channel layer 116), and can expose the second location of the channel layer 116 (the location where the second conductive pillar 118b is coupled to the channel layer 116), it is the scope protected by the present invention.

In some embodiments, the semiconductor device 100 of the present invention may be applied to three-dimensional (3D) AND flash memory, 3D NOR memory, or other suitable memory.

In comparison with the comparative example in which the memory structure surrounds the first conductive pillar and the second conductive pillar together (that is, the memory structure is annular), since the memory structure 132 according to an embodiment of the present invention surrounds the first location and exposes the second location, the second location to which the second conductive pillar 118b is coupled may correspond to the oxide layer 112 instead of the memory structure 132, so the current of the second conductive pillar 118b can be more fully closed by the oxide layer 112. The problem of over erasing can be avoided even if the threshold voltage is low, and the generation of current leakage can be prevented.

Figure 9:
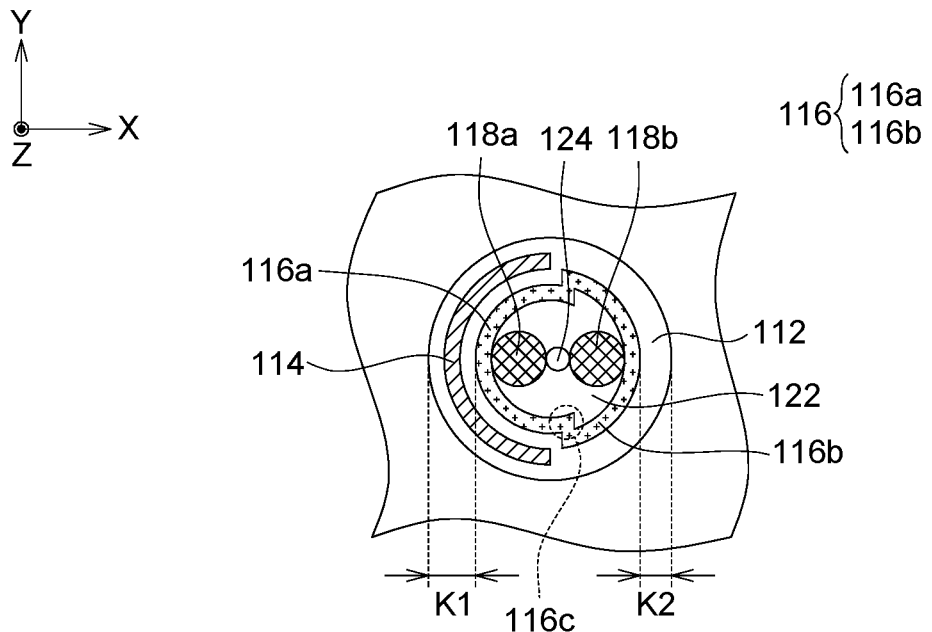
FIG. 9 is a top view of a memory string according to an embodiment of the present invention.

FIG. 9 is a top view of a memory string 102M according to an embodiment of the present invention. Since the thickness K1 of the memory structure 132 corresponding to the first side (also can be the first conductive pillar 118a or the first location) in the second direction (for example, the X direction) may be greater than the thickness K2 of the oxide layer 112 corresponding to the second side (also can be the second conductive pillar 118b or the second location) in the second direction (for example, the X direction), the inner surface of the channel layer 116 may have a protruding portion 116c. It should be understood that even if the inner surface of the channel layer 116 has a protruding portion 116c, it can still be regarded as a circle or a ring.

Figure 10:
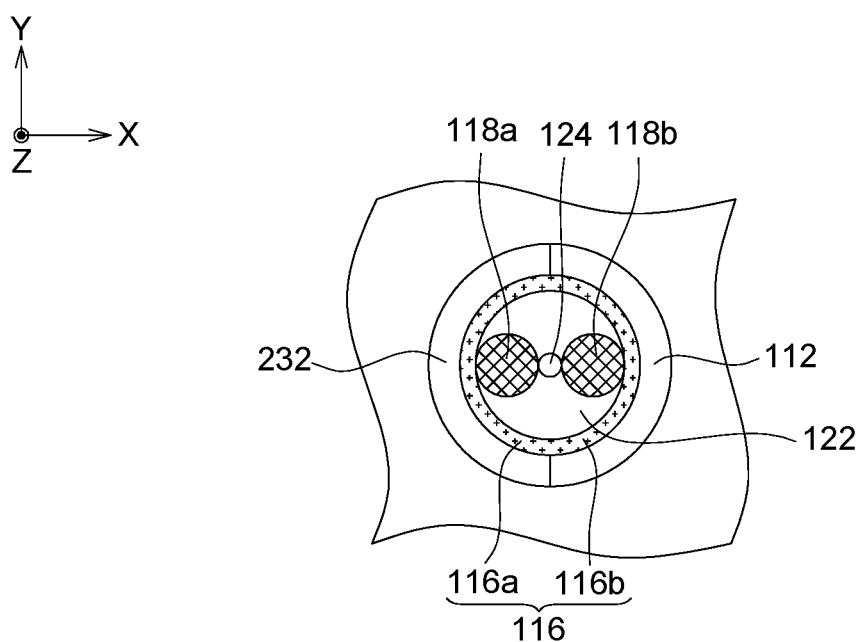
FIG. 10 is a top view of a memory string according to another embodiment of the present invention.

FIG. 10 is a top view of a memory string according to an embodiment of the present invention. The memory string in FIG. 9 is similar to the memory string in FIG. 8A, except that the memory structure 232 includes a ferroelectric material, but not formed by the first oxide layer, the nitride layer, and the second oxide layer.

In some embodiments, the ferroelectric material may include hafnium oxide (such as silicon-doped hafnium oxide), zirconium-doped hafnium oxide or other suitable materials.

FIG. 11 is a top view of an array layout of a semiconductor device according to an embodiment of the present invention. FIG. 11 is a schematic diagram after forming a plurality of input lines IL1, IL2 . . . and a plurality of output lines OL1, OL2 . . . on the semiconductor device 100 formed in FIGS. 1A to 8B.

Referring to FIG. 11, a plurality of memory strings 102M are disposed on the substrate 102 as a memory array along a second direction (for example, the X direction) and a third direction (for example, the Y direction). In the present embodiment, the first direction, the second direction, and the third direction are perpendicular to each other, but the present invention is not limited thereto. In this memory array, a plurality of memory strings 102M are disposed into a plurality of rows R1-R4 of memory strings 102M along the third direction, wherein two adjacent rows of memory strings 102M (for example, two adjacent rows R1 and R2 of memory strings 102M) have an offset distance D in the third direction, and the first locations of two adjacent rows of memory strings 102M are adjacent to each other. In other words, the memory structures 132 of the memory strings 102M in row R1 are adjacent to the memory structures 132 of the memory strings 102M in row R2, and are away from the oxide layers 112 of the memory strings 102M in row R2. The memory structures 132 of the memory strings 102M in the row R3 are adjacent to the memory structures 132 of the memory strings 102M in the row R4, and are away from the oxide layers 112 of the memory strings 102M in the row R4.

A plurality of conductive patterns 142 are disposed on the memory string 102M, and are electrically connected to one of the first conductive pillar 118a and the second conductive pillar 118b, respectively. The plurality of input lines IL1, IL2 . . . and the plurality of output lines OL1, OL2 . . . are parallel to each other and extend along the second direction. Each of the input lines (for example, the input line IL1) can be coupled to the corresponding first conductive pillar 118a through a first via (for example, 144a) and a corresponding conductive pattern 142. Each of the output lines (for example, the output line OL1) can be coupled to the corresponding second conductive pillar 118b through a second via (for example, 144b) and a corresponding conductive pattern 142. In the present embodiment, the first location and the second location are opposite to each other along the second direction, and the input lines IL1, IL2, . . . and the output lines OL1, OL2, . . . extend along the second direction, but the present invention does not limited thereto. In other embodiments, the input lines and the output lines may extend along a third direction (not shown), and the first direction, the second direction, and the third direction may be perpendicular to each other.

FIGS. 12A to 12D are top views illustrating the positional relationship between the array layout of the semiconductor devices 200 to 500 and the isolation trenches 246 to 546 according to some embodiments of the present invention. Among them, the structures of the memory strings 202M to 502M is the same or similar to that of the memory strings 102M, and the duplicates will not be described in detail, and the memory strings 202M to 502M in the FIGS. 12A to 12D only briefly show the positions of the first conductive pillars 218a to 518a and the second conductive pillars 218b to 518b, other elements of the memory string 202M to 502M can be more clearly understood by referring to FIGS. 8A and 8B.

Figure 12A:
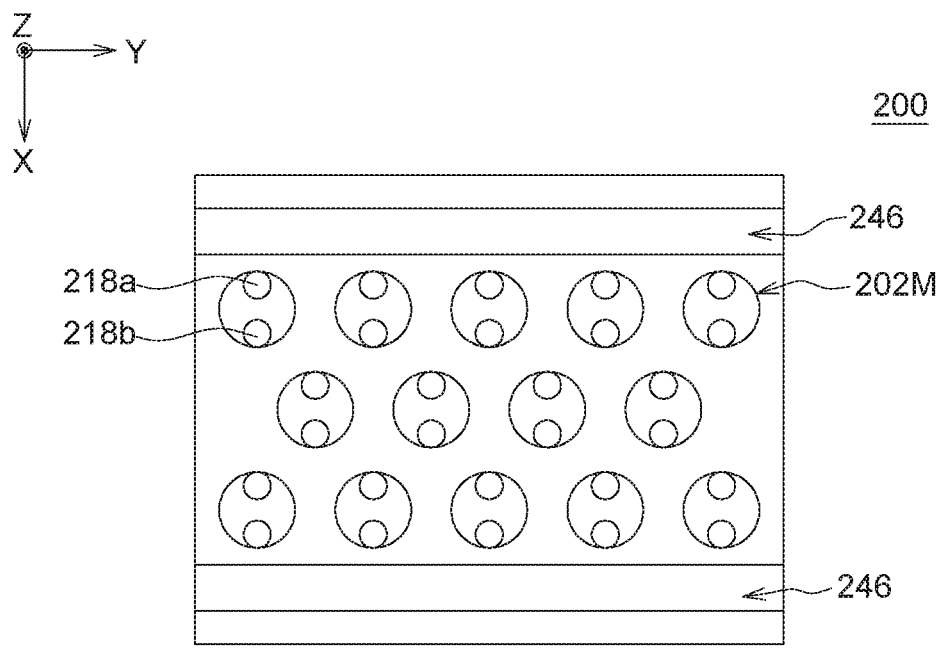
FIG. 12A is a top view illustrating a positional relationship between an array layout of a semiconductor device and an isolation trench according to an embodiment of the present invention.

FIG. 12A is a top view showing the positional relationship between the array layout of the semiconductor device 200 and the isolation trenches 246 according to an embodiment of the present invention.

Referring to FIG. 12A, the array layout of the memory strings 202M of the semiconductor device 200 is the same or similar to the array layout of the memory strings 102M of the semiconductor device 100 shown in FIG. 11. In the present embodiment, the first conductive pillars 218a coupled to the first location and the second conductive pillar 218b coupled to the second location are disposed along the second direction (for example, the X direction). That is, the extending direction of the connection line between the first conductive pillar 218a and the second conductive pillar 218b is parallel to the second direction. The plurality of isolation trenches 246 divide the stack S1 into a plurality of sub-stacks. The extending direction (for example, the Y direction) of each of the isolation trenches 246 can be perpendicular to the second direction (for example, the X direction), so that the extending direction of the connection line between the first conductive pillar 218a and the second conductive pillar 218b is perpendicular to the extending direction of the isolation trench 246. However, the present invention is not limited thereto. In some embodiments, the extending direction of the connection line between the first conductive pillar 218a and the second conductive pillar 218b may form an acute angle with the extending direction of the isolation trench 246.

Figure 12B:
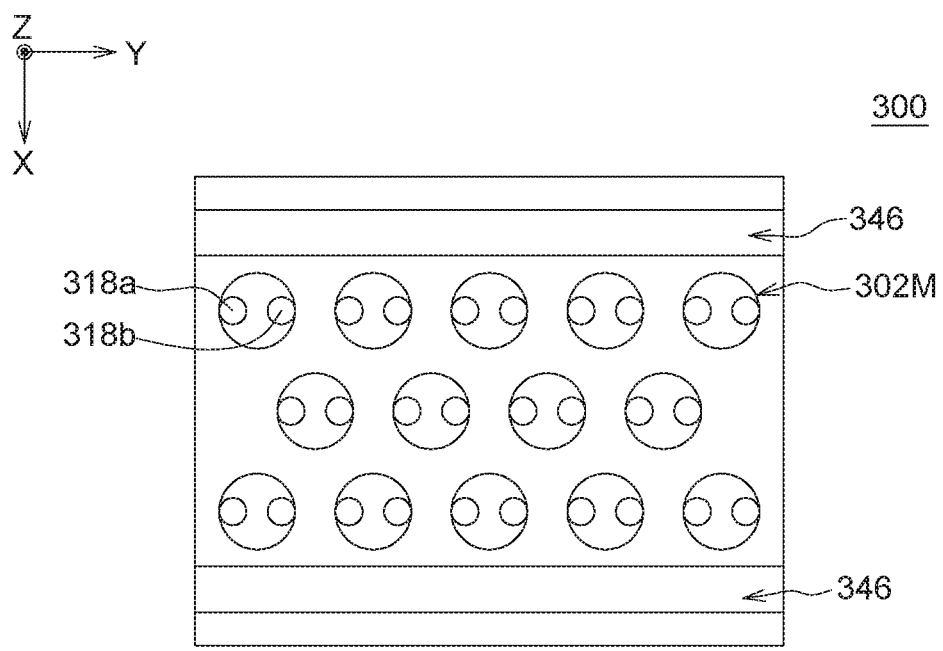
FIG. 12B is a top view illustrating a positional relationship between an array layout of a semiconductor device and an isolation trench according to another embodiment of the present invention.

FIG. 12B is a top view showing the positional relationship between the array layout of the semiconductor device 300 and the isolation trenches 346 according to another embodiment of the present invention.

Referring to FIG. 12B, the first conductive pillar 318a coupled to the first location and the second conductive pillar 318b coupled to the second location are disposed along the third direction (for example, the Y direction). That is, the extending direction of the connection line between the first conductive pillar 318a and the second conductive pillar 318b is parallel to the third direction. The plurality of isolation trenches 346 divide the stack S1 into a plurality of sub-stacks, and the extending direction (for example, the Y direction) of each of the isolation trenches 346 can be parallel to the third direction, so that the extending direction of the connection line between the first conductive pillar 318a and the second conductive pillar 318b is parallel to the extending direction of the isolation trench 346. However, the present invention is not limited thereto. In some embodiments, the extending direction of the connection line between the first conductive pillar 318a and the second conductive pillar 318b may form an acute angle with the extending direction of the isolation trench 346.

Figure 12C:
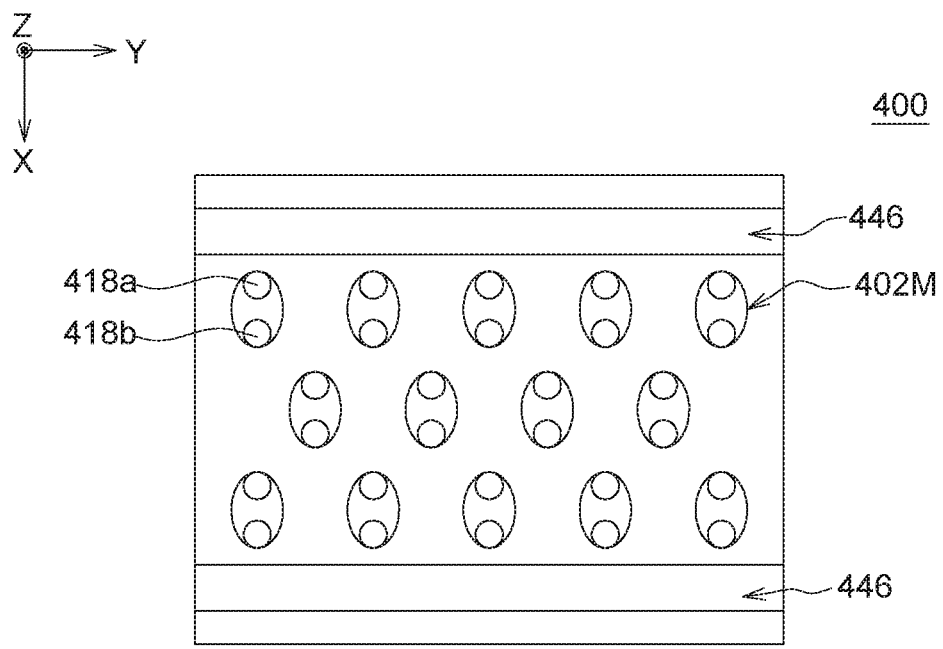
FIG. 12C is a top view showing a positional relationship between an array layout of a semiconductor device and an isolation trench according to further embodiment of the present invention.

FIG. 12C is a top view showing the positional relationship between the array layout of the semiconductor device 400 and the isolation trenches 446 according to further embodiment of the present invention.

Referring to FIG. 12C, the array layout of the semiconductor device 400 is similar to the array layout of the semiconductor device 200. The difference is in that the cross section of the memory string 402M in the second direction is an oval cross section rather than a circular cross section. In the embodiment, the first conductive pillar 418a coupled to the first location and the second conductive pillar 418b coupled to the second location are disposed along the second direction (for example, the X direction). That is, the extending direction of the connection line between the first conductive pillar 418a and the second conductive pillar 418b is parallel to the second direction. The plurality of isolation trenches 446 divide the stack S1 into a plurality of sub-stacks. The extending direction of each of the isolation trenches 446 may be perpendicular to the second direction, so that the extending direction of the connection line between the first conductive pillar 418a and the second conductive pillar 418b and the extending direction of the isolation trench 246 are perpendicular. However, the present invention is not limited thereto. In some embodiments, the extending direction of the connection line between the first conductive pillar 418a and the second conductive pillar 418b may form an acute angle with the extending direction of the isolation trench 446.

Figure 12D:
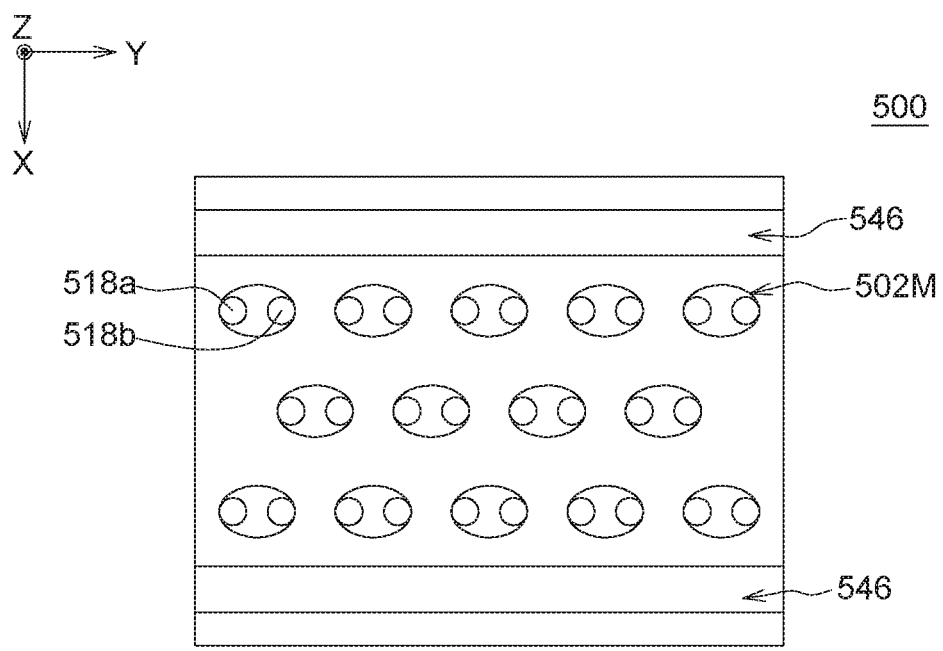
FIG. 12D is a top view showing a positional relationship between an array layout of a semiconductor device and an isolation trench according to further embodiment of the present invention.

FIG. 12D is a top view showing the positional relationship between the array layout of the semiconductor device 500 and the isolation trenches 546 according to further embodiment of the present invention.

Referring to FIG. 12D, the array layout of the semiconductor device 500 is similar to the array layout of the semiconductor device 300. The difference is in that the cross section of the memory string 502M formed along the second direction and the third direction is an oval cross section rather than a circular cross section. The first conductive pillar 518a coupled to the first location and the second conductive pillar 518b coupled to the second location are disposed along the third direction (for example, the Y direction). That is, the extending direction of the connection line between the first conductive pillar 518a and the second conductive pillar 518b is parallel to the third direction. The plurality of isolation trenches 546 divide the stack S1 into a plurality of sub-stacks. The extending direction of each of the isolation trenches 546 can be parallel to the third direction, so that the extending direction of the connection line between the first conductive pillar 518a and the second conductive pillar 518b is parallel to the extending direction of the isolation trench 546. However, the present invention is not limited thereto. In some embodiments, the extending direction of the connection line between the first conductive pillar 518a and the second conductive pillar 518b may form an acute angle with the extending direction of the isolation trench 546.

Figure 13:
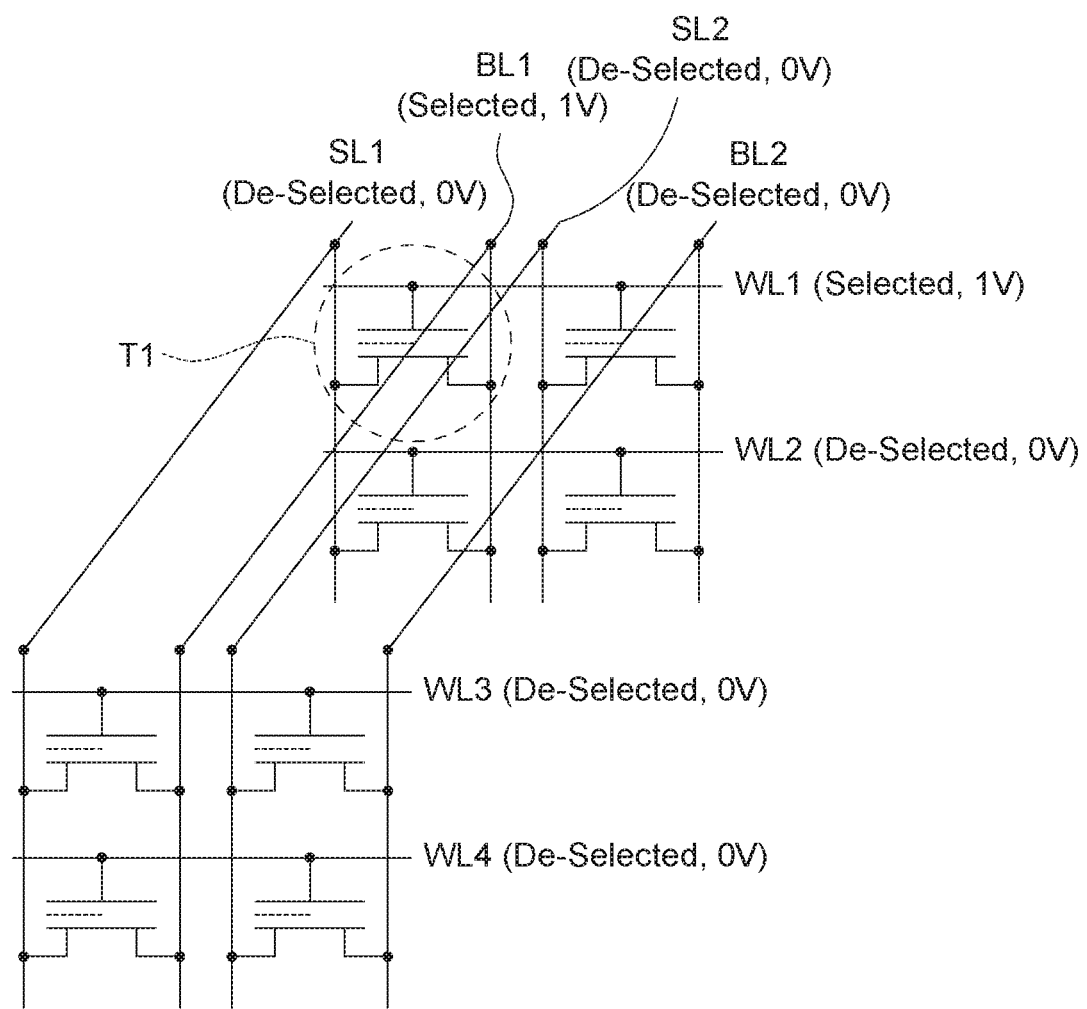
FIG. 13 is a circuit diagram of a semiconductor device according to an embodiment of the present invention.

FIG. 13 is a circuit diagram of a semiconductor device according to an embodiment of the present invention. For example, it is applied to semiconductor devices 100 to 500, a semiconductor device including a memory string as shown in FIG. 10, or other suitable semiconductor device.

Referring to FIG. 13, taking the semiconductor device 100 as an example, the conductive layer 126 can be used as the word lines WL1-WL4. Each intersection of the conductive layers 126 and the memory strings 102M can form 1.5 transistors (for example, transistor T1) (also called 1.5T). The word lines WL1-WL4 coupled to the transistors can serve as the gates of the corresponding transistors, respectively. For example, the word line WL1 coupled to the transistor T1 can be used as the gate of the transistor T1. The input lines IL1, IL2, . . . coupled to the first conductive pillar 118a can serve as source lines SL1, SL2, . . . . The output lines OL1, OL2, . . . coupled to the second conductive pillar 118b can be used as the bit lines BL1, BL2, . . . .

In comparison with the comparative example in which the memory structure surrounds the first conductive pillar and the second conductive pillar (i.e., a 1T memory device), since the memory structure (for example, memory structure 132 or 232) of an embodiment of the present invention surrounds the first location of the channel layer (the location where the first conductive pillar 118a is coupled) and does not surround the second location of the channel layer (the location where the second conductive pillar 118b is coupled). The second location is surrounded by the oxide layer 112, so a 1.5T memory device can be formed, which can avoid the problem of over erasing, prevent the current leakage of the transistors drain or bit line, and a low read voltage can further be used during operation, for example, a read voltage of 1V. As shown in FIG. 13, when the read operation is performed, the selected word line WL1 can be applied with 1V, the selected bit line BL1 can be applied with 1V, the unselected source lines SL1, SL2, unselected bit lines and the unselected word lines WL2-WL4 can be applied with 0V.

FIG. 14A to 14G are schematic diagrams illustrating a manufacturing process of a semiconductor device 600 according to further embodiment of the present invention. FIGS. 14A to 14G show the plane formed by the X direction and the Y direction, and only show the manufacturing process of one of the memory strings.

Figure 14A:
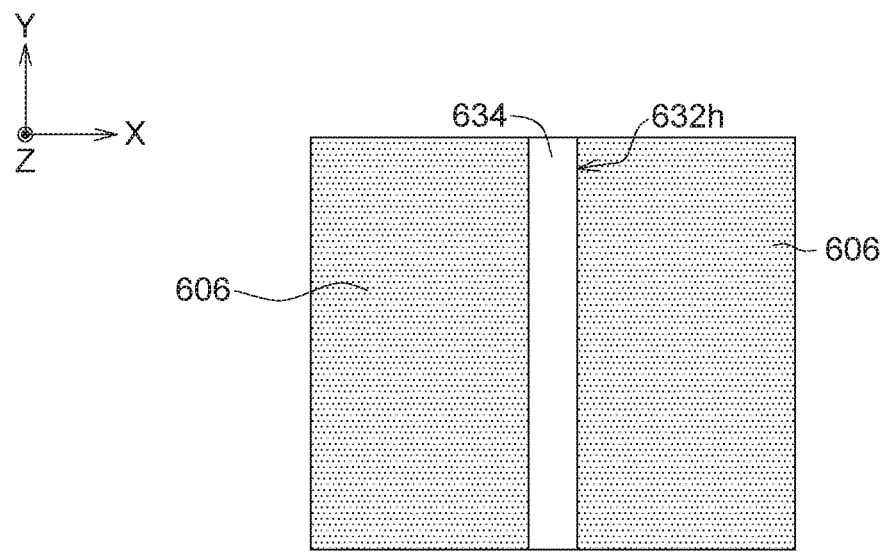
FIG. 14A to FIG. 14G are schematic diagrams illustrating a manufacturing process of a semiconductor device according to another embodiment of the present invention.

Referring to FIG. 14A, after forming a plurality of insulating layers and a plurality of sacrificial layers 606 alternately stacked with the insulating layers as shown in FIG. 1A, a plurality of slits 632h penetrating the stack along the first direction (for example, Z direction) and exposing the upper surface of the substrate are formed. In other embodiments, the slits 632h may penetrate a portion of the stack along the first direction, but do not expose the upper surface of the substrate. In some embodiments, each of the slits 632h may extend in a third direction (for example, Y direction) and penetrate a center point of a predetermined position of the memory string. After that, an insulating material is filled in the slit 632h to form an isolation structure 634 extending in the third direction (for example, the Y direction). The insulating material is, for example, an oxide, such as silicon oxide (such as silicon dioxide).

Figure 14B:
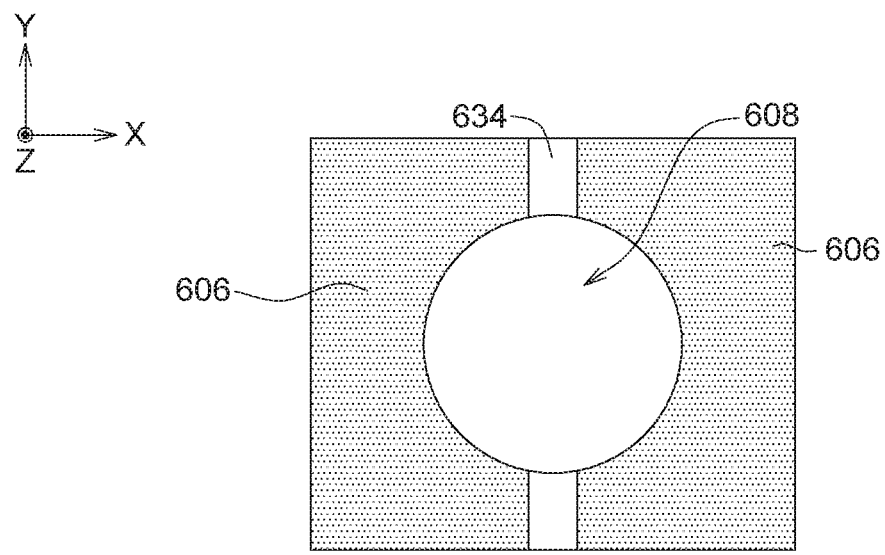

Referring to FIG. 14B, a plurality of openings 608 penetrating the stack along a first direction (for example, the Z direction) are formed. The openings 608 may expose the upper surface of the substrate. In other embodiments, the openings 608 may penetrate a portion of the stack along the first direction, but do not expose the upper surface of the substrate.

Figure 14C:
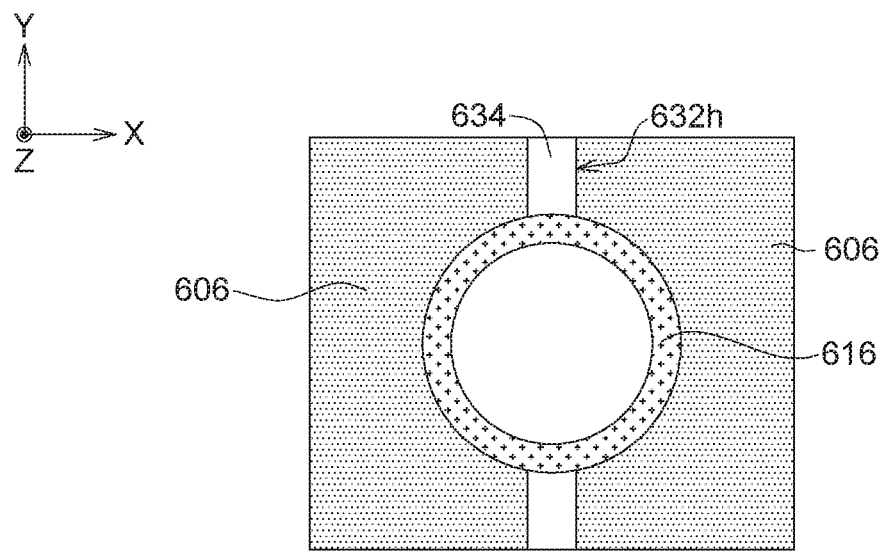

Referring to FIG. 14C, a channel layer 616 is formed in the opening 608 by a deposition process, that is, the channel layer 616 is formed on the inner surface of the opening 608. The material of the channel layer 616 is, for example, un-doped polycrystalline silicon.

Figure 14D:
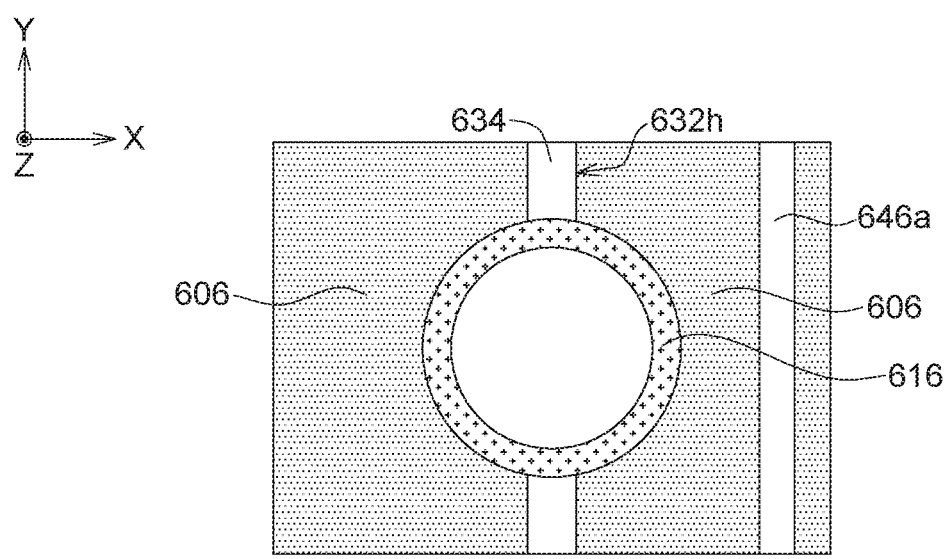

Referring to FIG. 14D, a first isolation trench 646a penetrating the stack along a first direction (for example, Z direction) and extending along a third direction (for example, Y direction) is formed. That is, the extending direction of the first isolation trench 646a is parallel to the extending direction of the isolation structure 634.

Figure 14E:
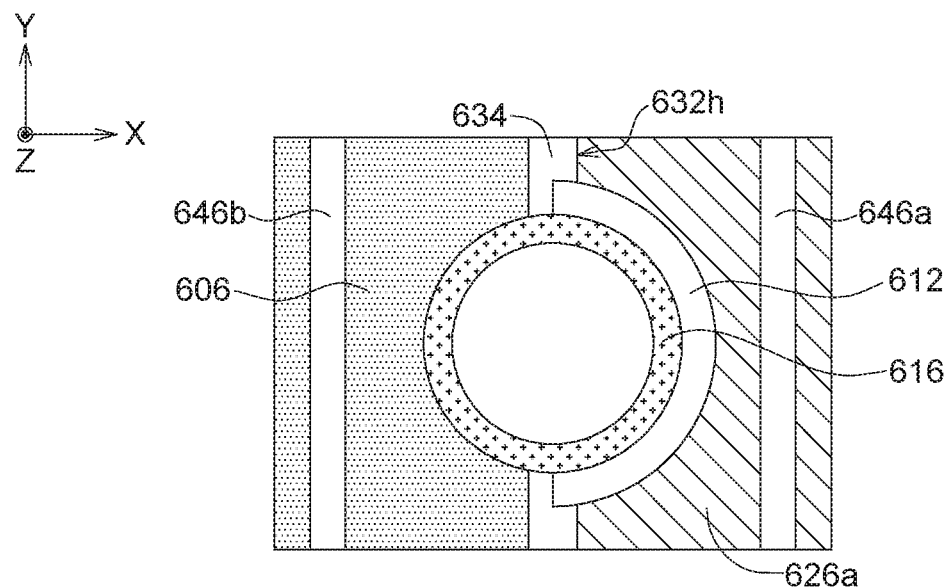

Referring to FIG. 14E, a portion of the sacrificial layers 606 is removed through the first isolation trench 646a by a selective etching process. That is, the sacrificial layers 606 disposed on one side of the isolation structure 634 adjacent to the first isolation trench 646a are removed. Thereafter, an oxide material and a conductive material are sequentially filled into the locations where the sacrificial layers 606 are removed to form an oxide layer 612 and a first conductive layer 626a. Next, a second isolation trench 646b is formed on one side of the channel layer 616 opposite to the first isolation trench 646a, and the extending direction of the second isolation trench 646b is parallel to the extending direction of the first isolation trench 646a. In detail, the oxide layer 612 surrounds one side of the channel layer 616 adjacent to the first isolation trench 646a. The material of the oxide layer 612 is, for example, the same as the isolation structure 634, and is, for example, silicon oxide (such as silicon dioxide).

Figure 14F:
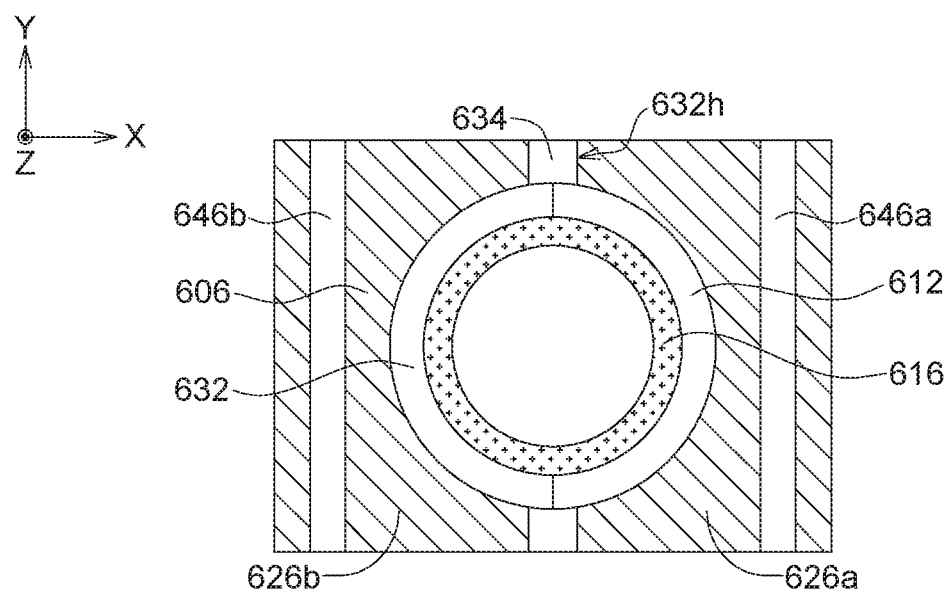

Referring to FIG. 14F, the remaining sacrificial layers 606 are removed through the second isolation trench 646b by a selective etching process, that is, the sacrificial layers 606 located on one side of the isolation structure 634 adjacent to the second isolation trench 646b are removed. Thereafter, the memory material and the conductive material are sequentially filled in the positions where the sacrificial layers 606 are removed to form a memory structure 632 and a second conductive layer 626b. The material of the first conductive layer 626a and the second conductive layer 626b is, for example, polycrystalline silicon, amorphous silicon, tungsten (W), cobalt (Co), aluminum (Al), tungsten silicide ($WSi_x$), or cobalt silicide ($CoSi_x$).

Figure 14G:
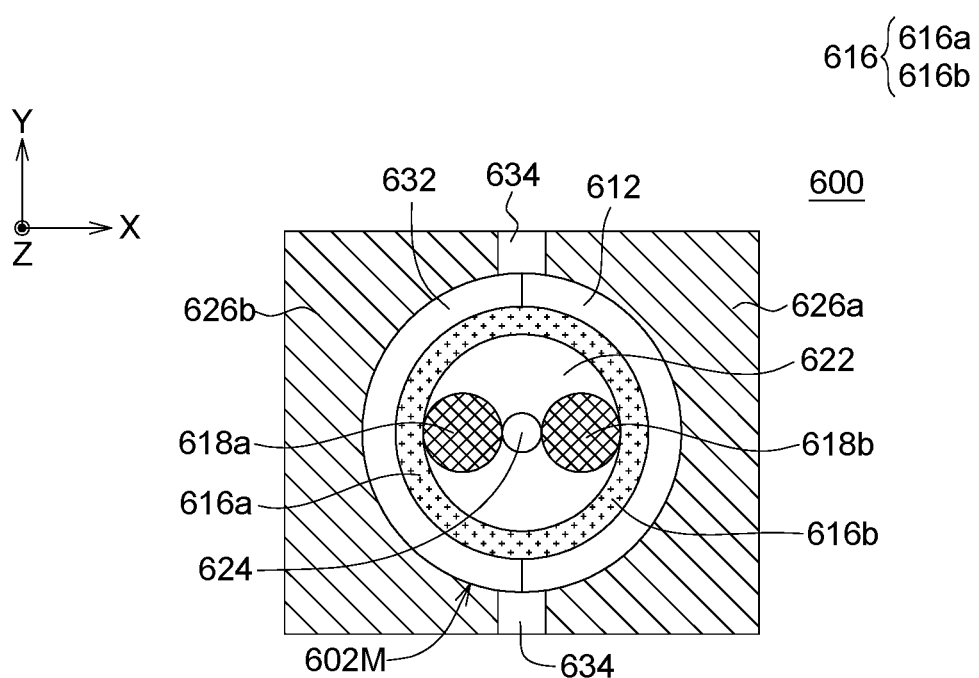

Referring to FIG. 14G, an insulating material layer 622, an insulating pillar 624, a first conductive pillar 618a, and a second conductive pillar 618b are formed in the opening 608 to form a semiconductor device 600 according to a manufacturing method similar to that described in FIGS. 8A and 8B and related paragraphs. In other embodiments, the step of forming the insulating material layer 622, an insulating pillar 624, a first conductive pillar 618a, and a second conductive pillar 618b in the opening 608 as stated above may be performed before the formation of the first isolation trench 646a (as shown in FIG. 14D) and after the step shown in FIG. 14C.

In the present embodiment, a conductive layer in the stack of the semiconductor device 600 includes a first conductive layer 626a and a second conductive layer 626b. Each of intersections between the first conductive layer 626a, the second conductive layer 626b and the memory string 602M can form two transistors (also referred to as 2T). The two transistors are respectively controlled by the first gate and the second gate. Further, the second conductive layer 626b may be the first gate, and the first conductive layer 626a may be the second gate. The first gate and the second gate are separated from each other by the isolation structure 634. The first gate is adjacent to the first location where the first conductive pillar 618a is coupled, and the second gate is adjacent to the second location where the second conductive pillar is coupled. In addition, the first gate corresponds to the memory structure 632, and used as a memory gate; the second gate corresponds to the oxide layer 612, and used as a selection gate. The oxide layer 612 is disposed between the channel layer 616 and the second gate (such as the first conductive layer 626a), and the memory structure 632 is disposed between the channel layer 616 and the first gate (such as the second conductive layer 626b).

Figure 18A:
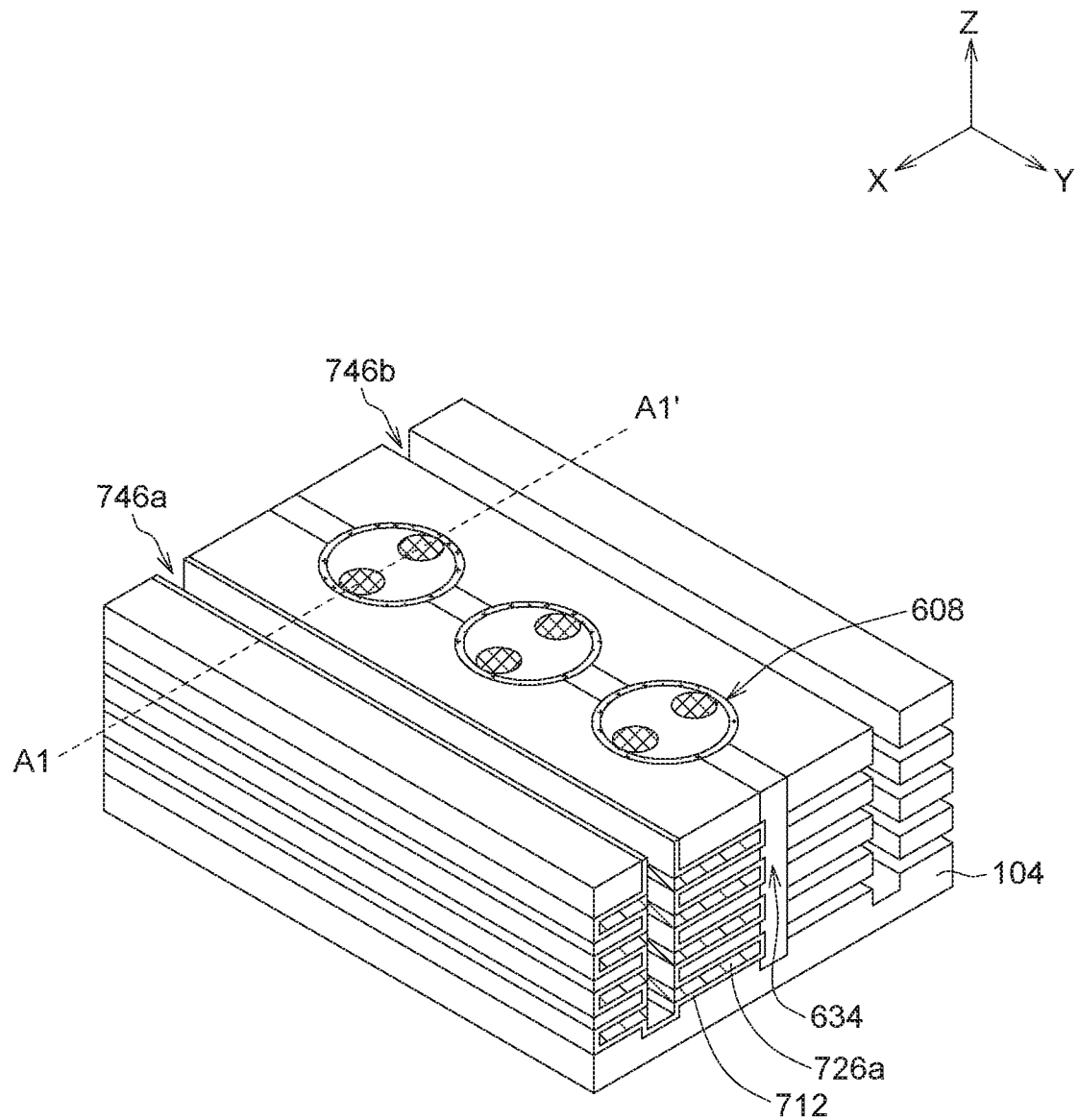
Figure 18B:
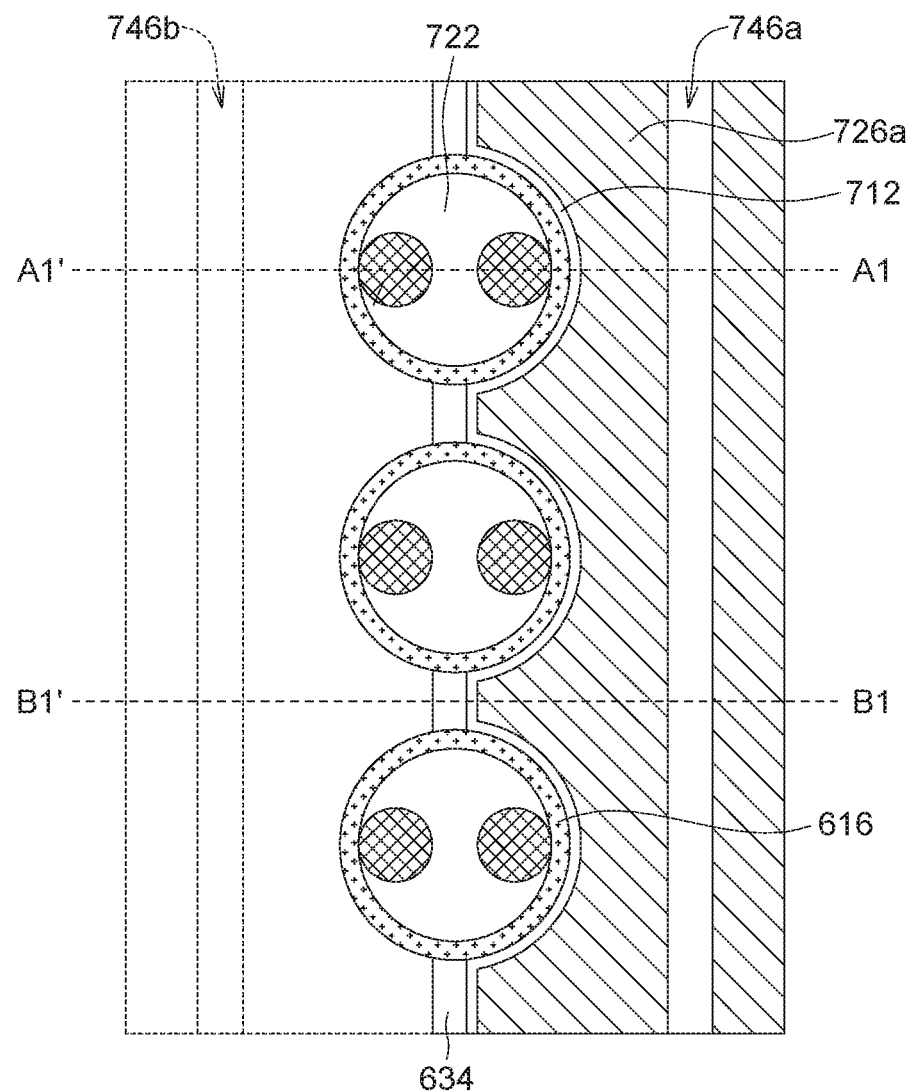
Figure 18C:
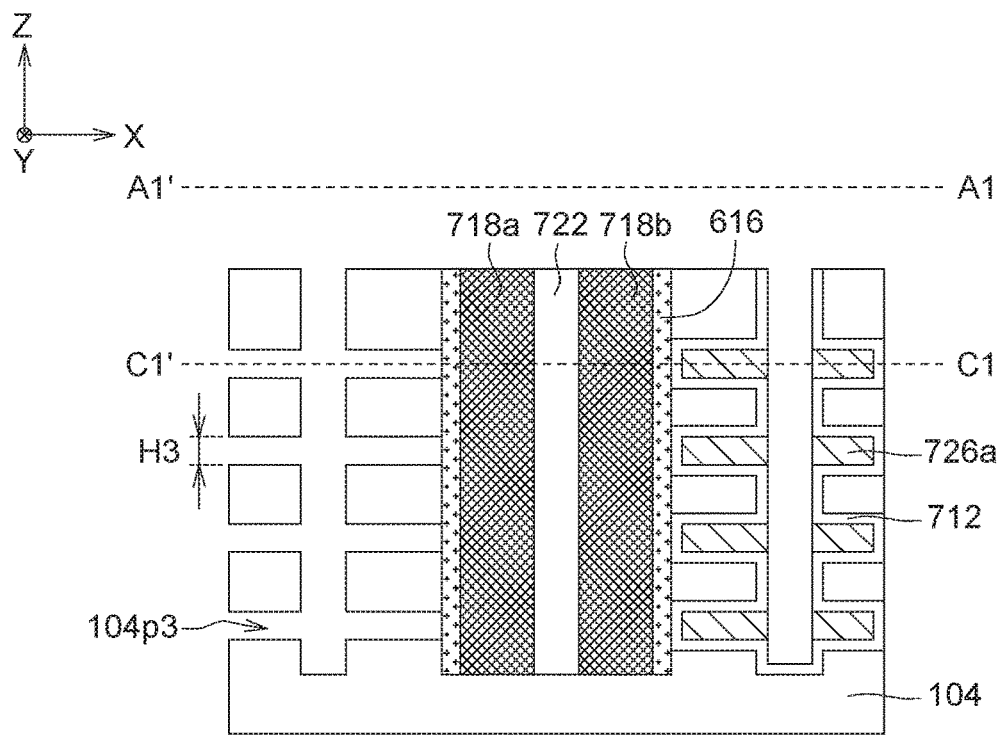
Figure 18D:
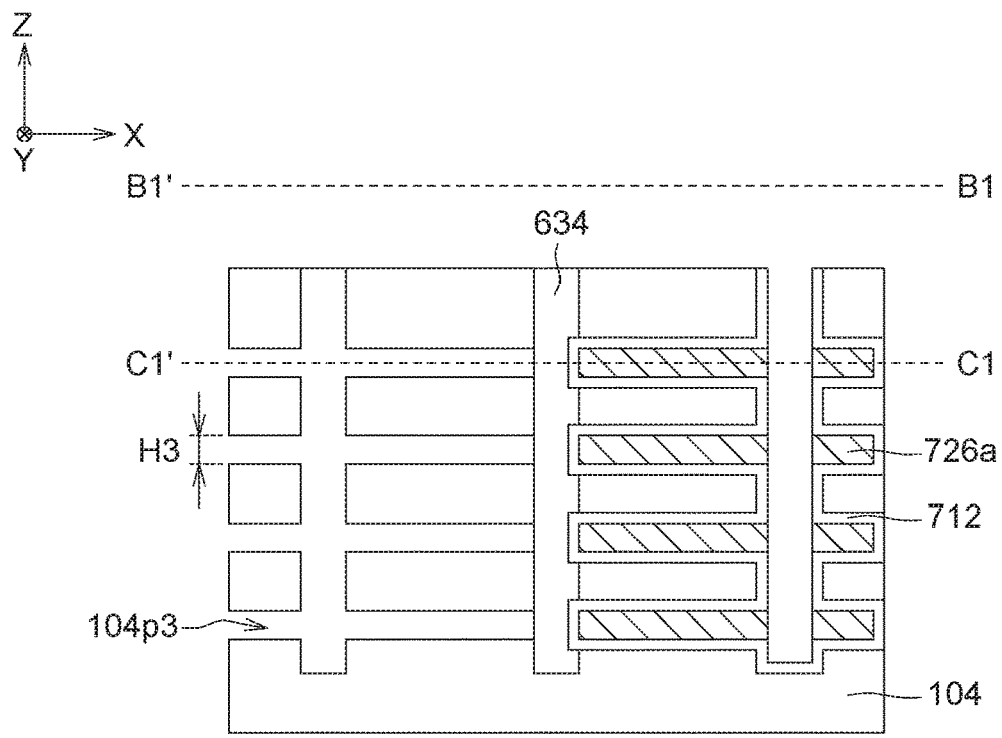
Figure 19A:
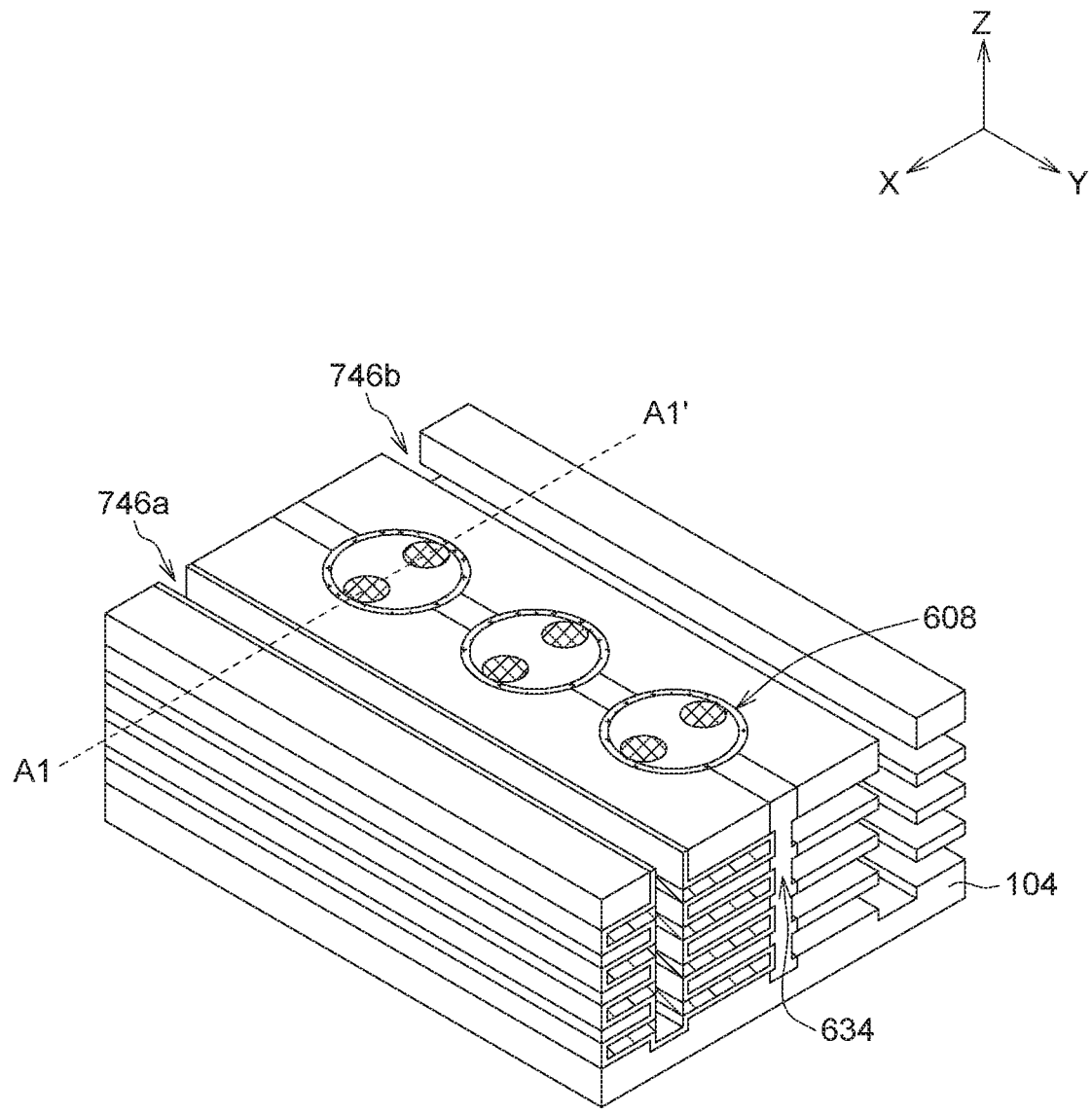
Figure 19B:
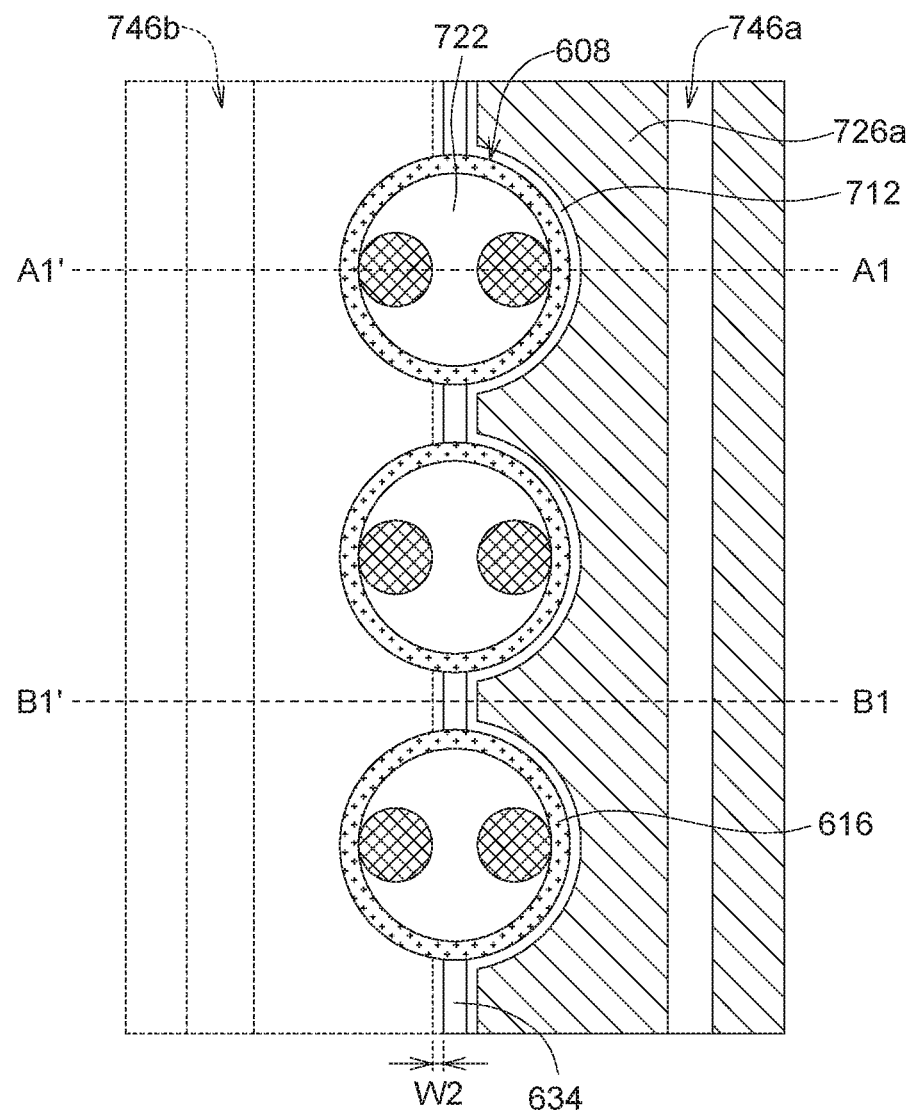
Figure 19C:
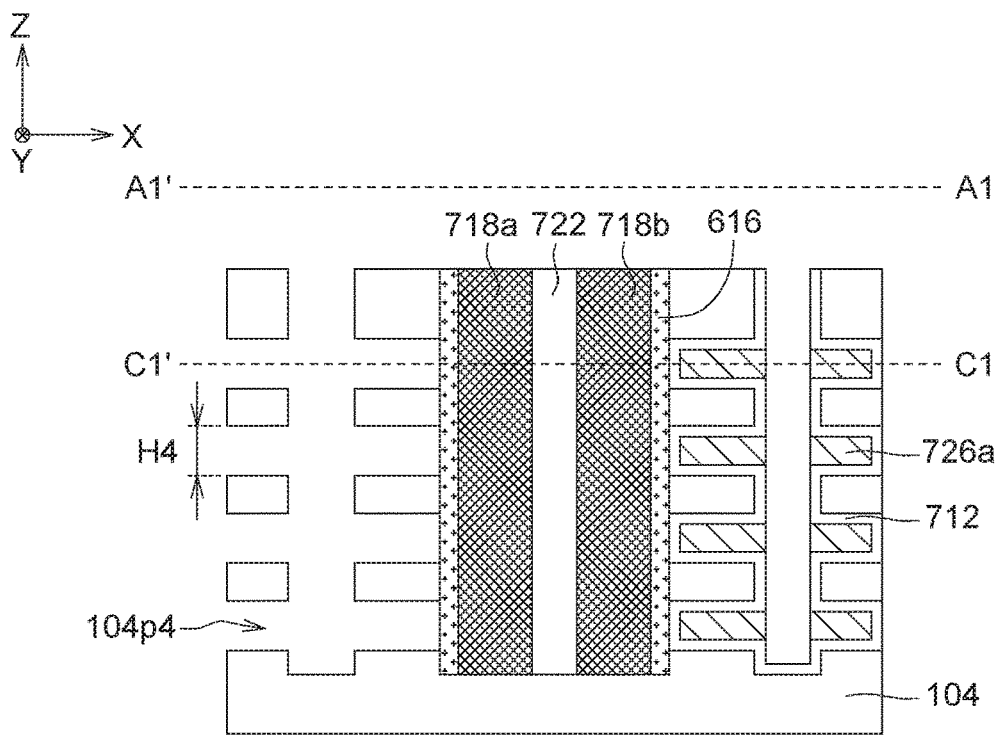
Figure 19D:
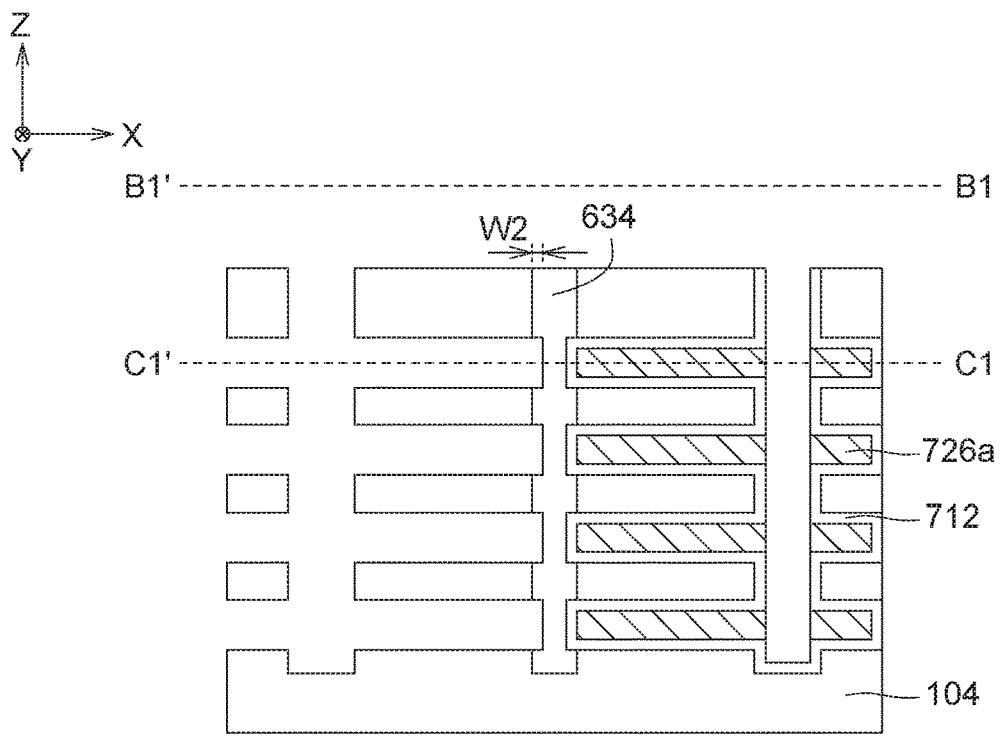
Figure 20A:
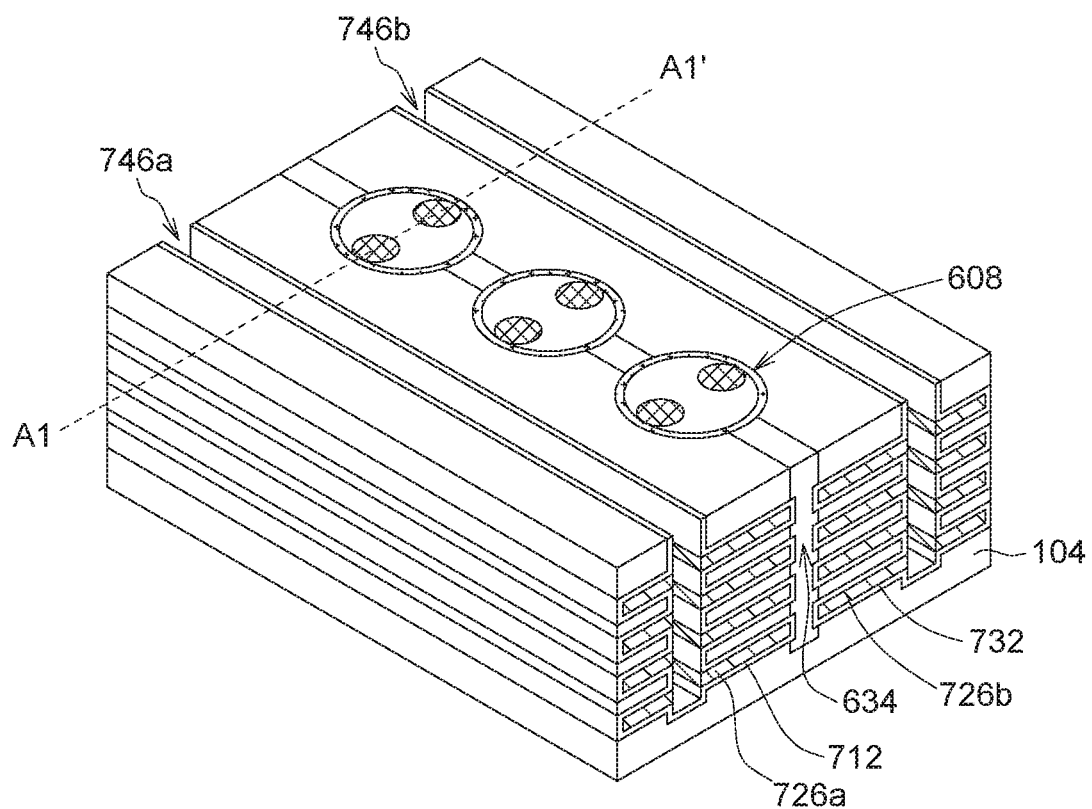
Figure 20B:
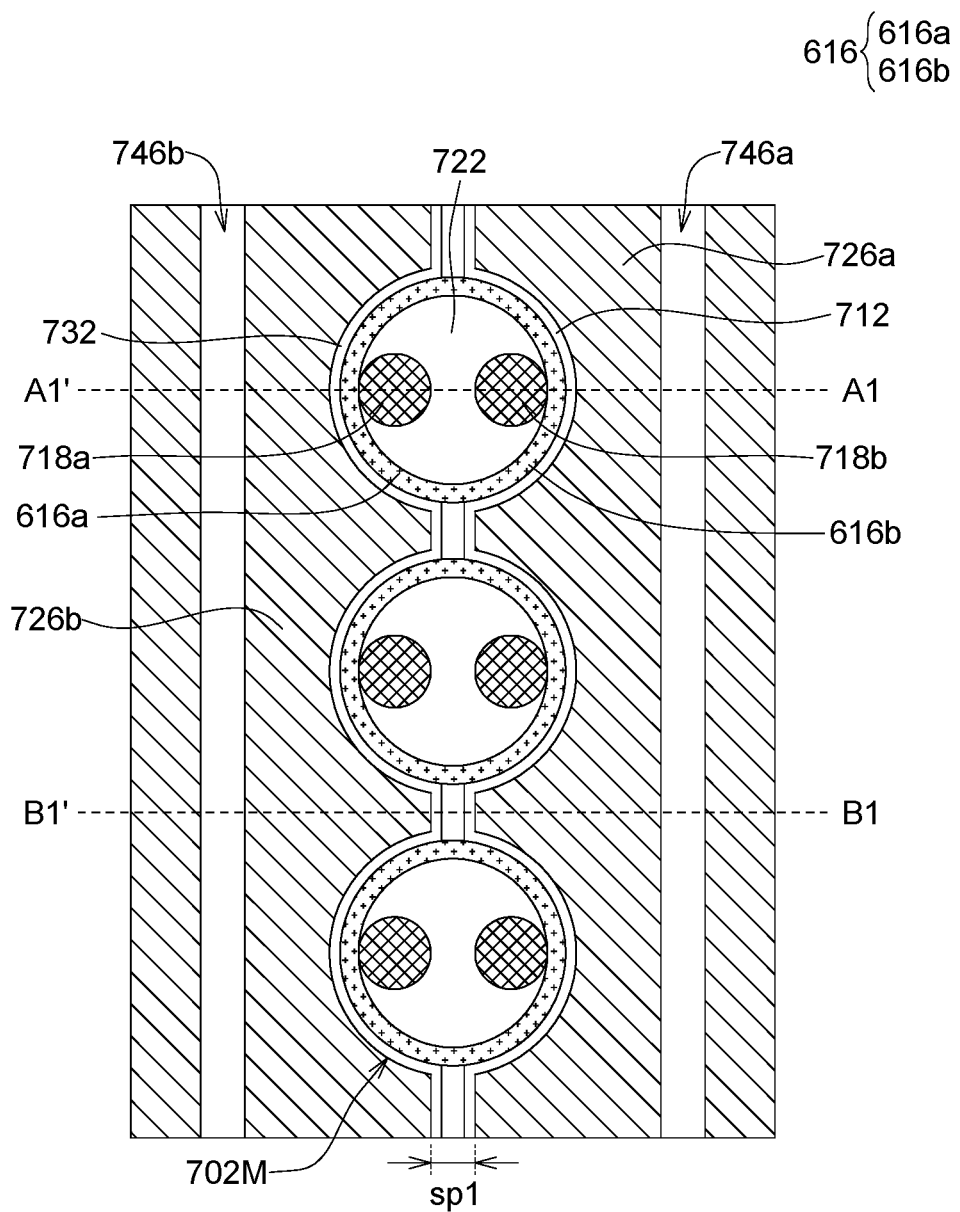
Figure 20C:
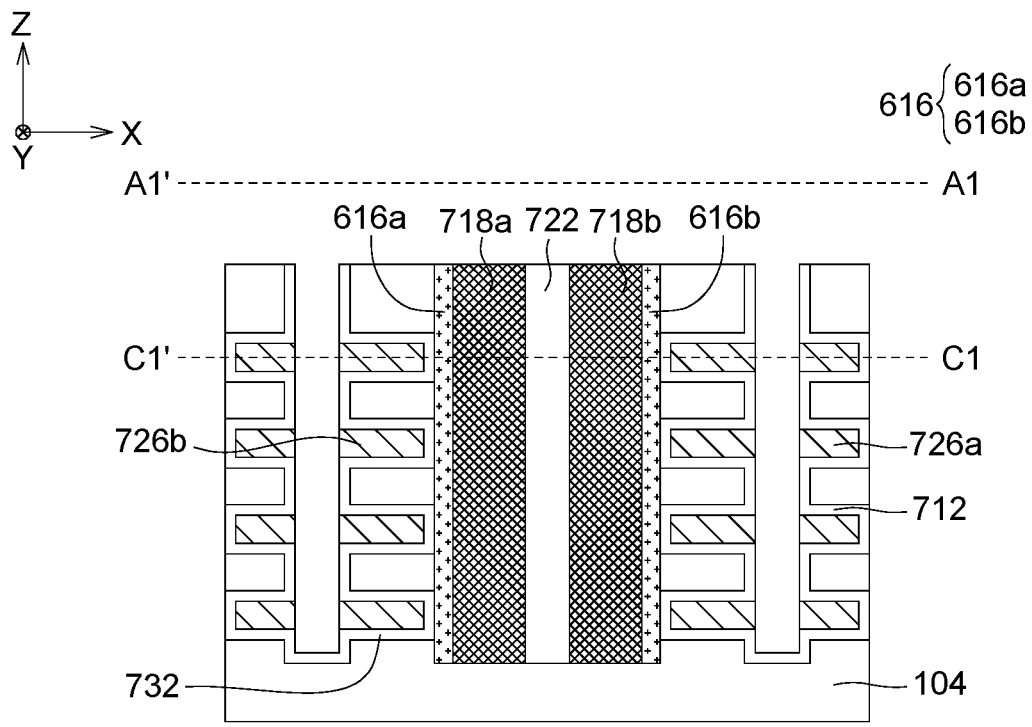
Figure 20D:
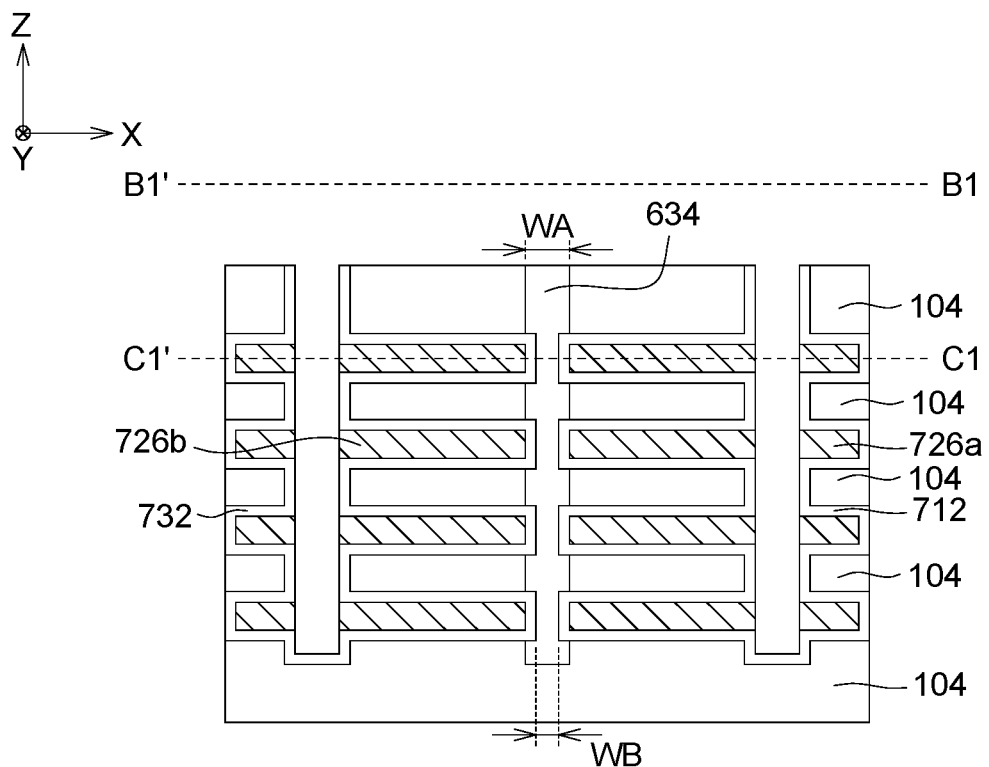
Figure 20E:
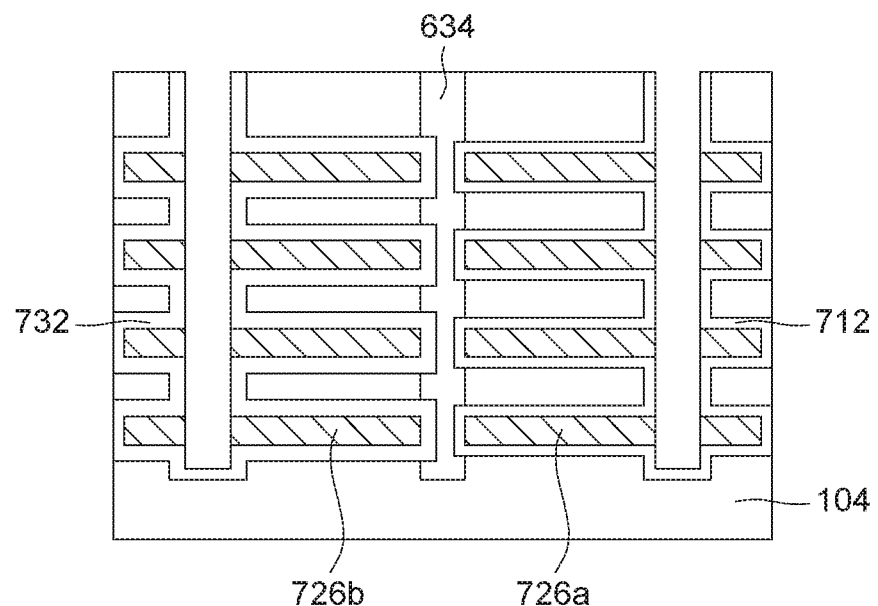

FIGS. 15A-20E are schematic diagrams illustrating a manufacturing process of a semiconductor device 700 according to yet another embodiment of the present invention. Among them, FIGS. 15A, 16A, 17A, 18A, 19A and 20A show a partial perspective view of the semiconductor device 700. FIGS. 15B, 16B, 17B, 18B, 19B, and 20B show top views of the semiconductor device 700, corresponding to the planes formed by the X direction and Y direction taken along line C1-C1' of the FIGS. 15C-5D, 16C-16D, 17C-17D, 18C-18D, 19C-19D, and 20C-20D, respectively. FIGS. 15C, 16C, 17C, 18C, 19C, and 20C show cross-sectional views taken along lines A1-A1' in FIGS. 15B, 16B, 17B, 18B, 19B, and 20B, respectively. FIGS. 15D, 16D, 17D, 18D, 19D, and 20D show cross-sectional views taken along lines B1-B1' of FIGS. 15B, 16B, 17B, 18B, 19B, and 20B, respectively. FIG. 20E illustrates a cross-sectional view taken along line B1-B1' in FIG. 20B according to some embodiments of the present invention.

A portion of the method of manufacturing the semiconductor device 700 is the same or similar to that of the semiconductor device 600. After the steps shown in FIGS. 14A-14C, an insulating material layer 722, a first conductive pillar 718a, and a second conductive pillar 718b are formed in the opening 608 by a manufacturing method similar to that described in FIGS. 8A and 8B and related paragraphs, as shown in FIGS. 15A-15D. In some embodiments, an insulating pillar (not shown) may be formed between the first conductive pillar 718a and the second conductive pillar 718b. In some embodiments, the steps of forming the insulating material layer 722, the insulating pillar (not shown), the first conductive pillar 718a, and the second conductive pillar 718b may be performed after the steps shown in FIGS. 15A-20E are completed. Next, referring to FIGS. 15A to 15D, a first isolation trench 746a is formed that penetrates through the stack along the first direction (e.g., the Z direction) and extends along the third direction (e.g., the Y direction). That is, the extending direction of the first isolation trench 746a is parallel to the extending direction of the isolation structure 634. After that, a portion of the sacrificial layer 606 is removed through the first isolation trench 746a by a selective etching process, that is, the sacrificial layers 606 disposed on the side of the isolation structure 634 adjacent to the first isolation trench 746a are removed, and a plurality of first lateral openings 104p1 are formed at the positions where the sacrificial layers 606 are removed (that is, between the insulating layers 104 adjacent to the first isolation trench 746a).

Figure 15A:
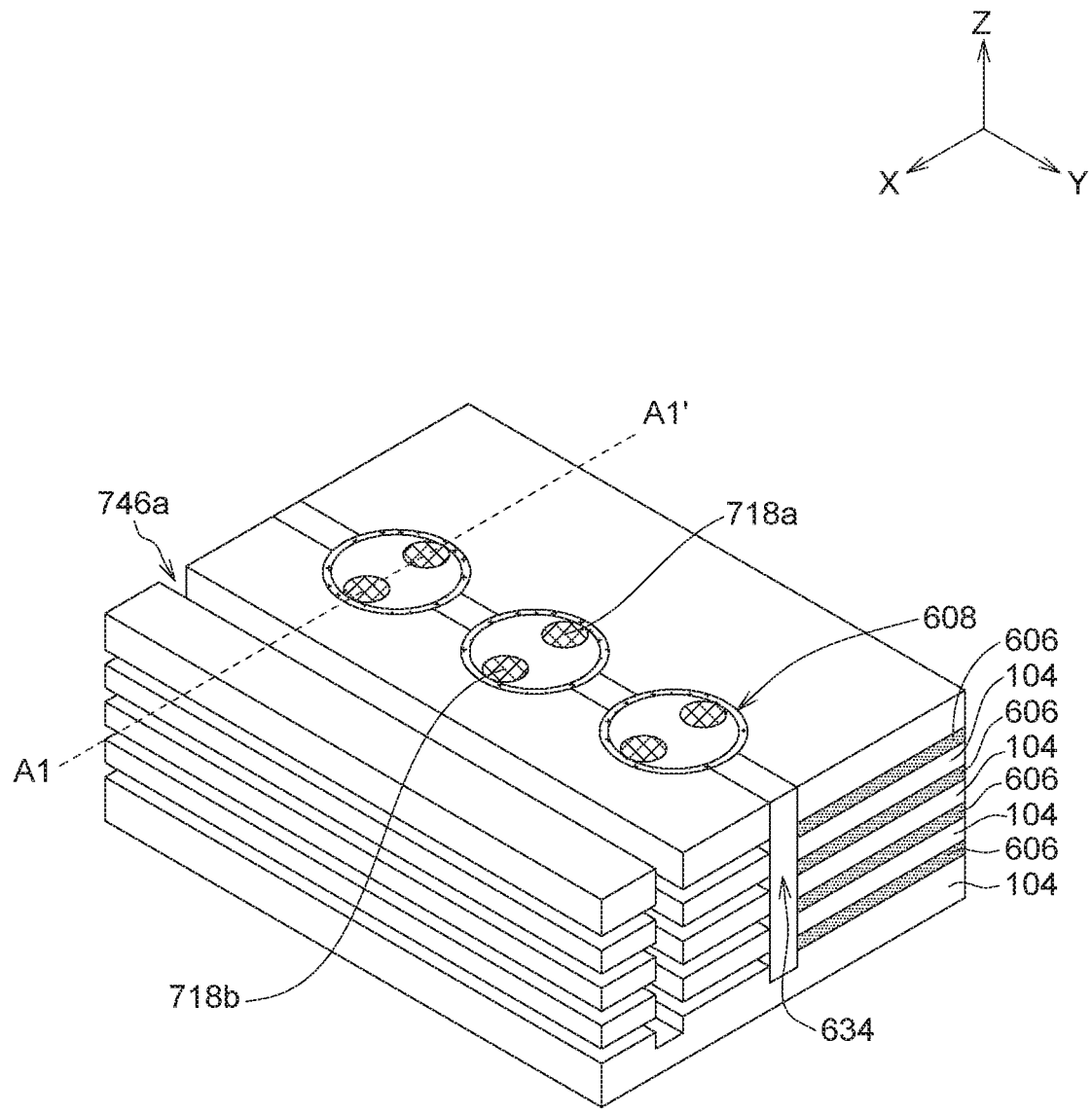
FIG. 15A to FIG. 20E are schematic diagrams illustrating a manufacturing process of a semiconductor device according to further embodiment of the present invention.
Figure 15B:
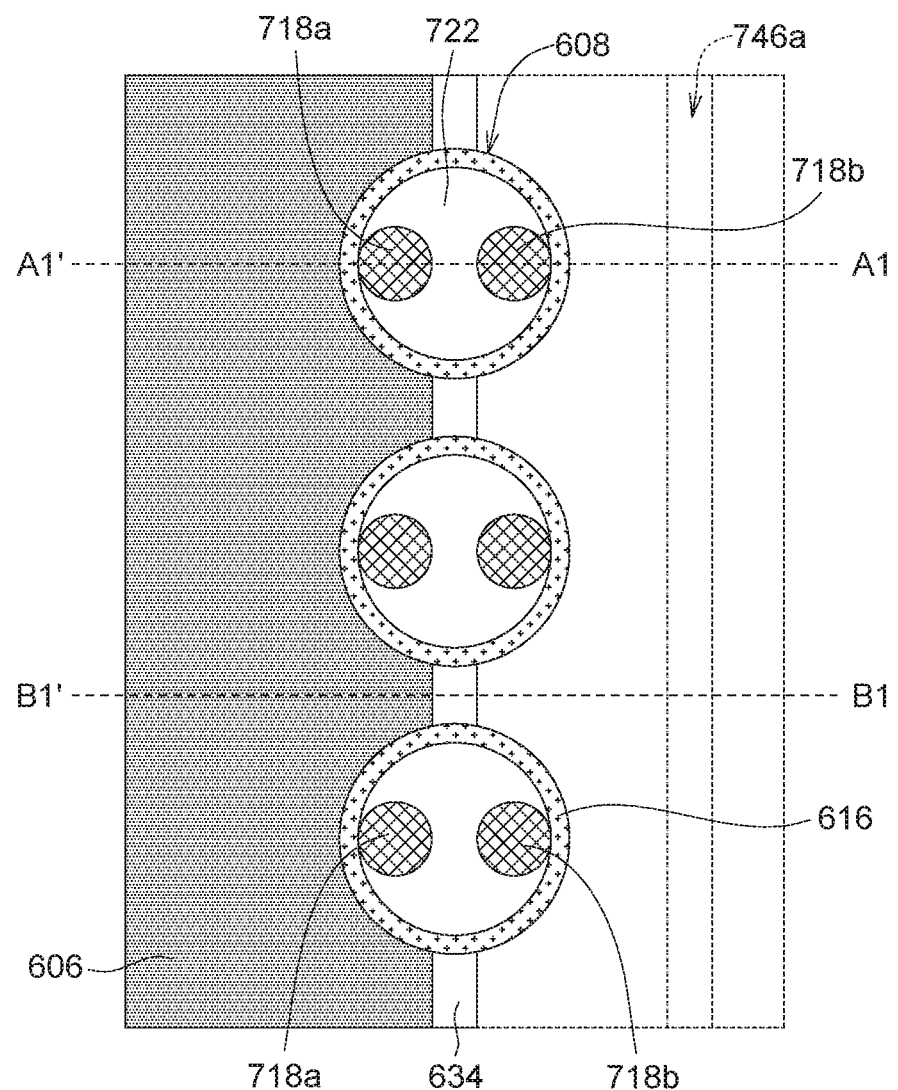
Figure 15C:
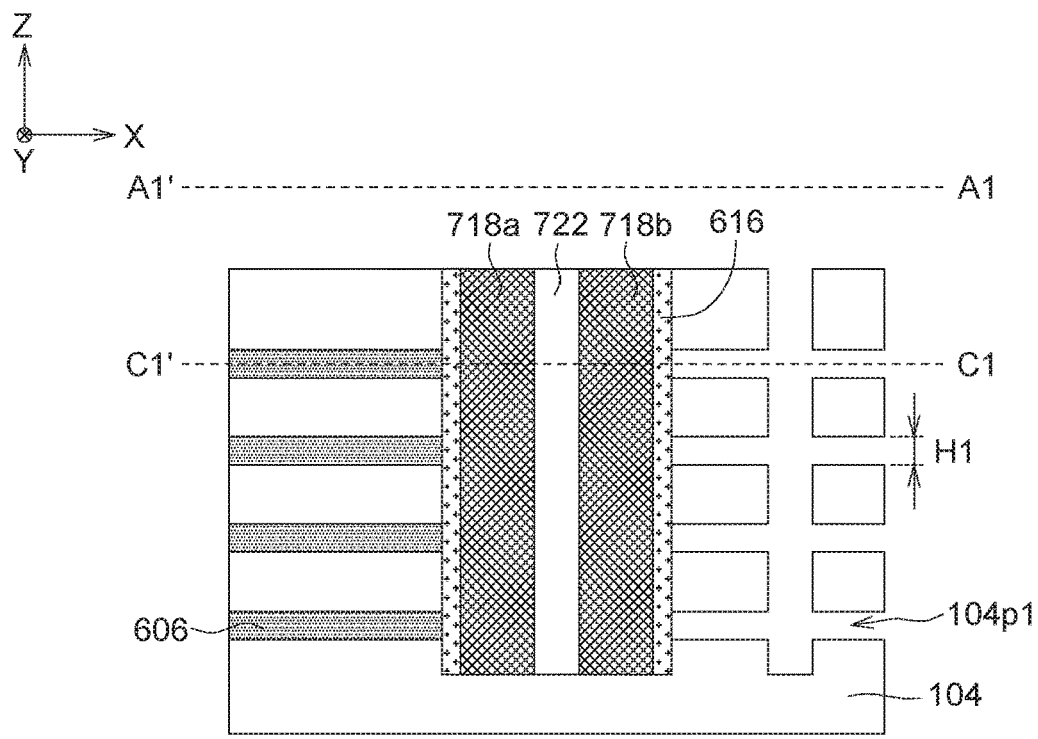
Figure 15D:
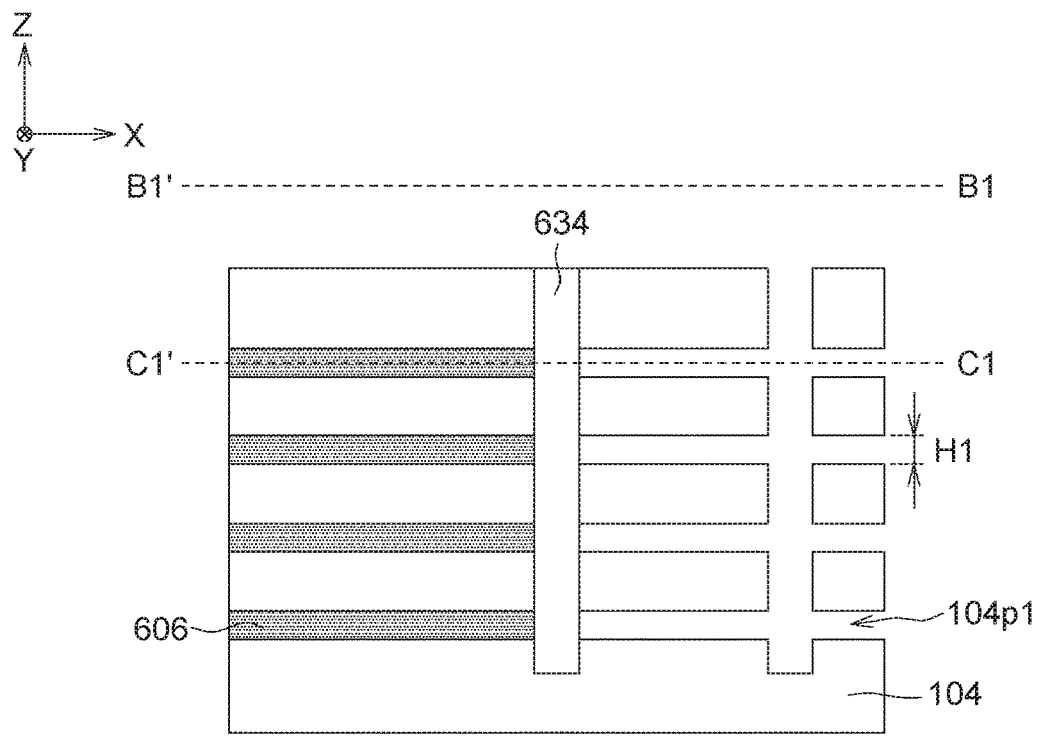
Figure 16A:
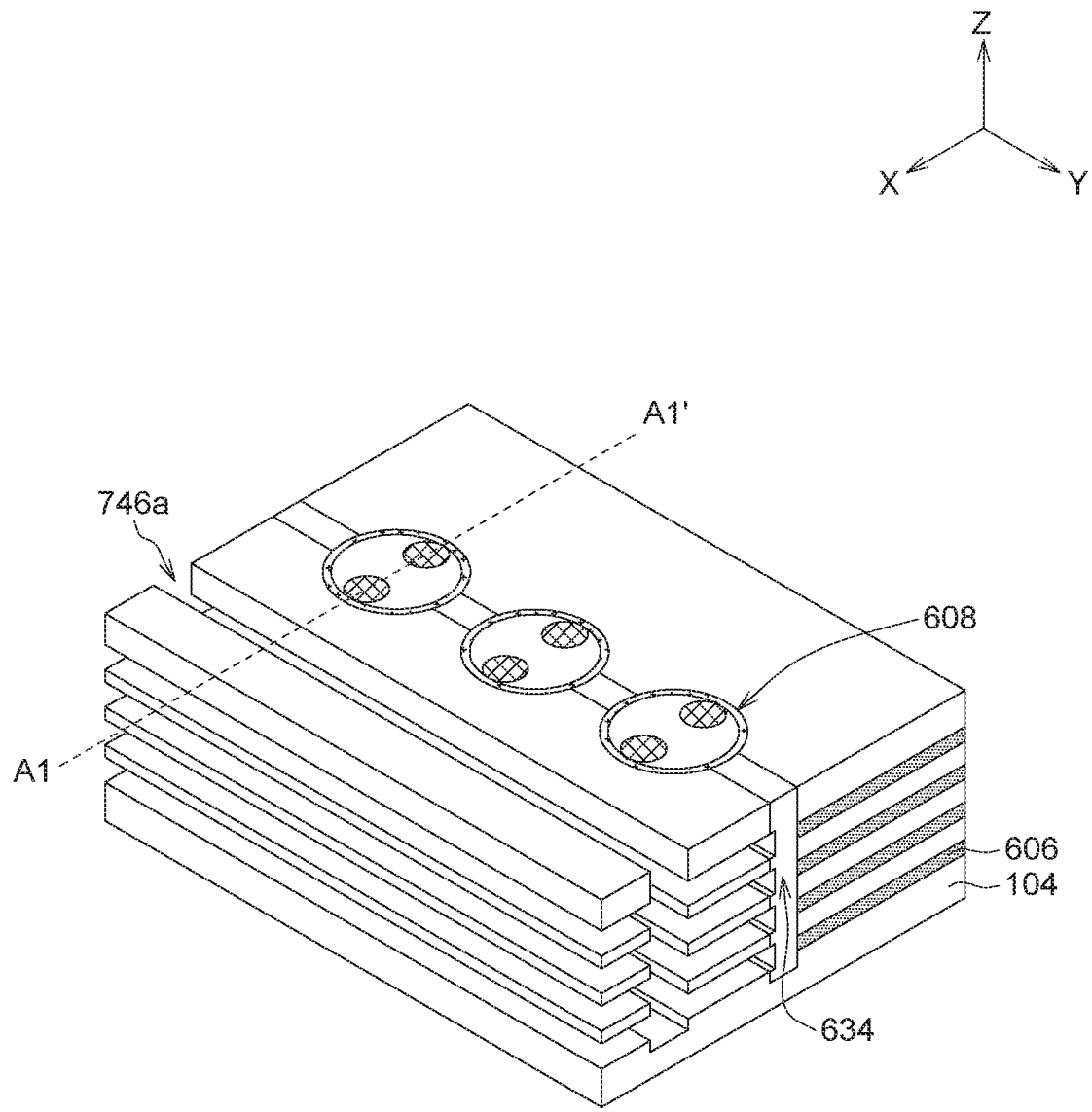
Figure 16B:
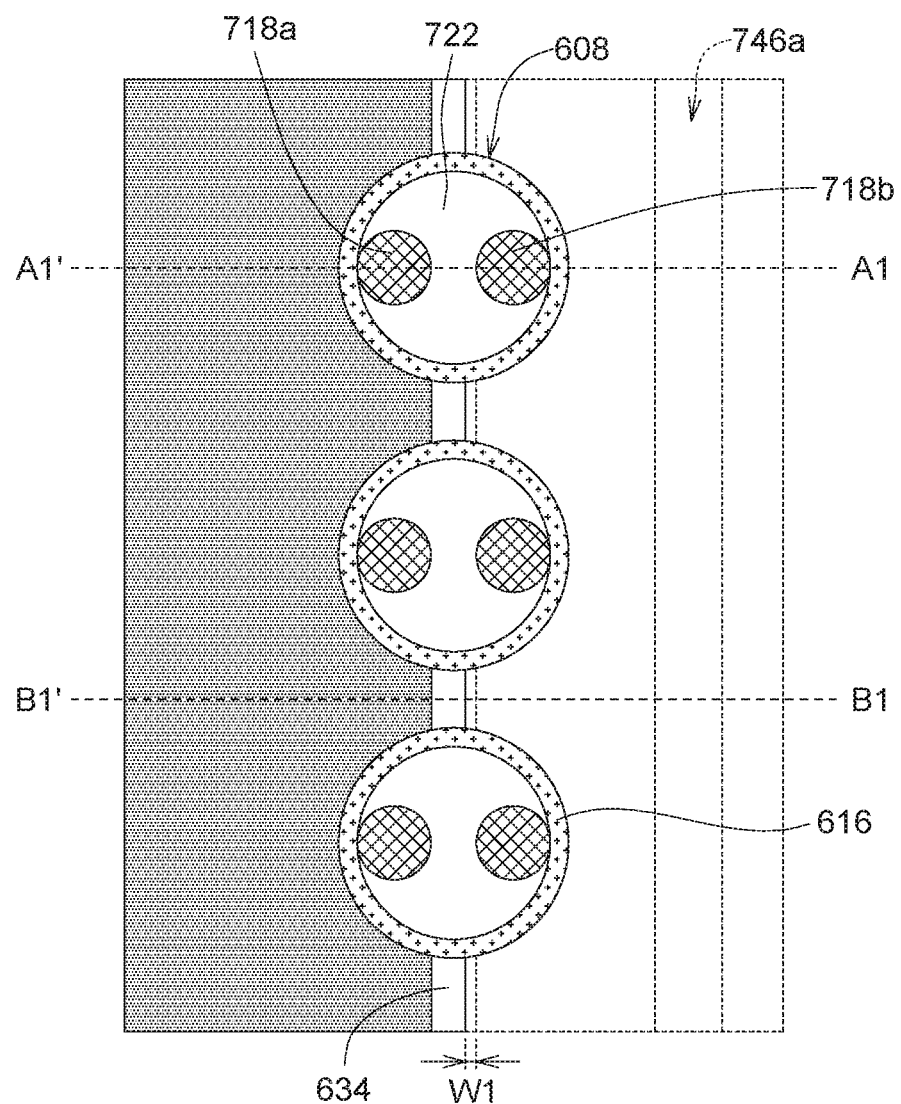
Figure 16C:
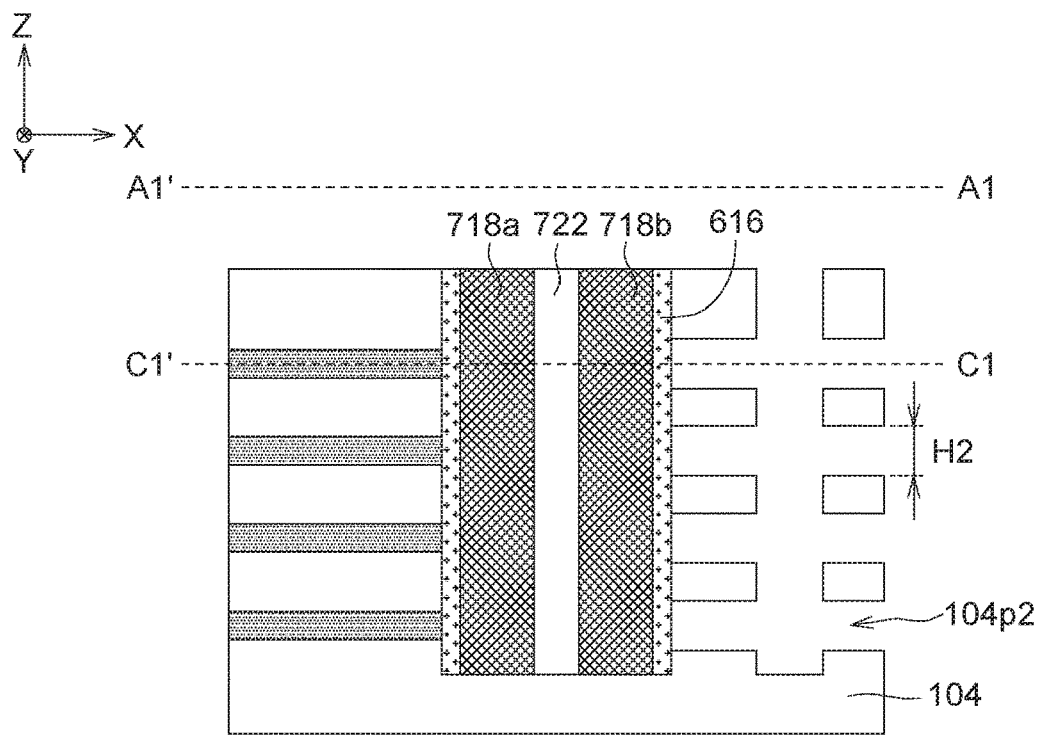
Figure 16D:
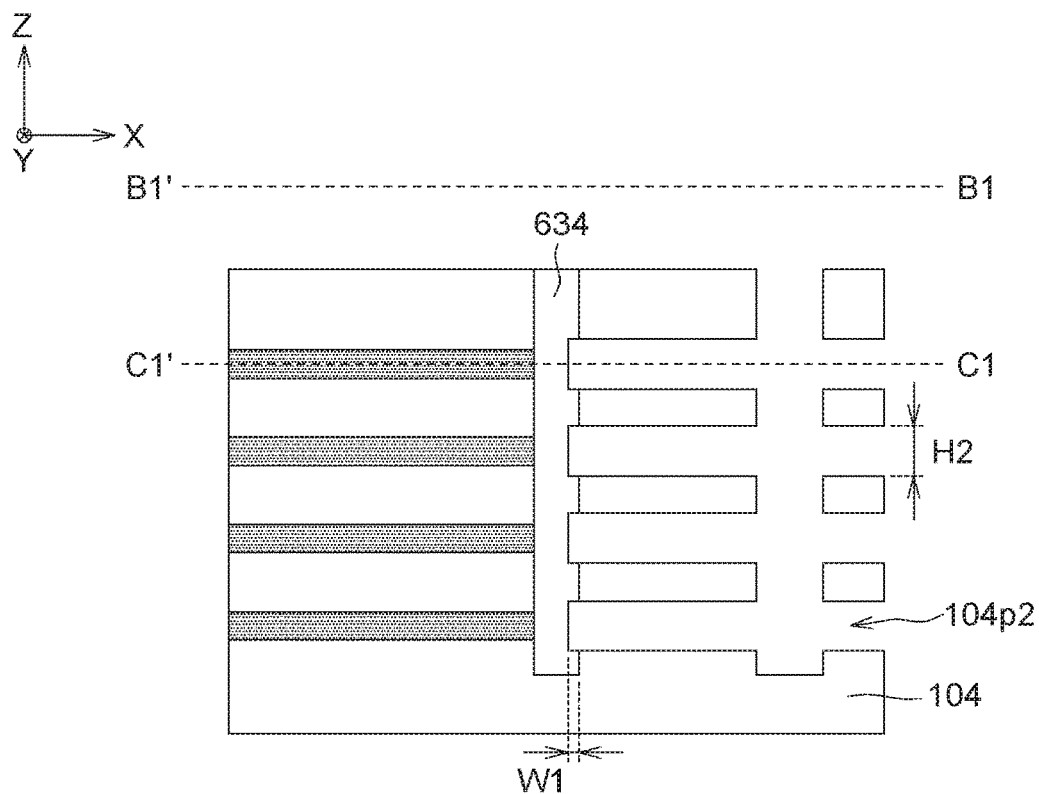
Figure 17A:
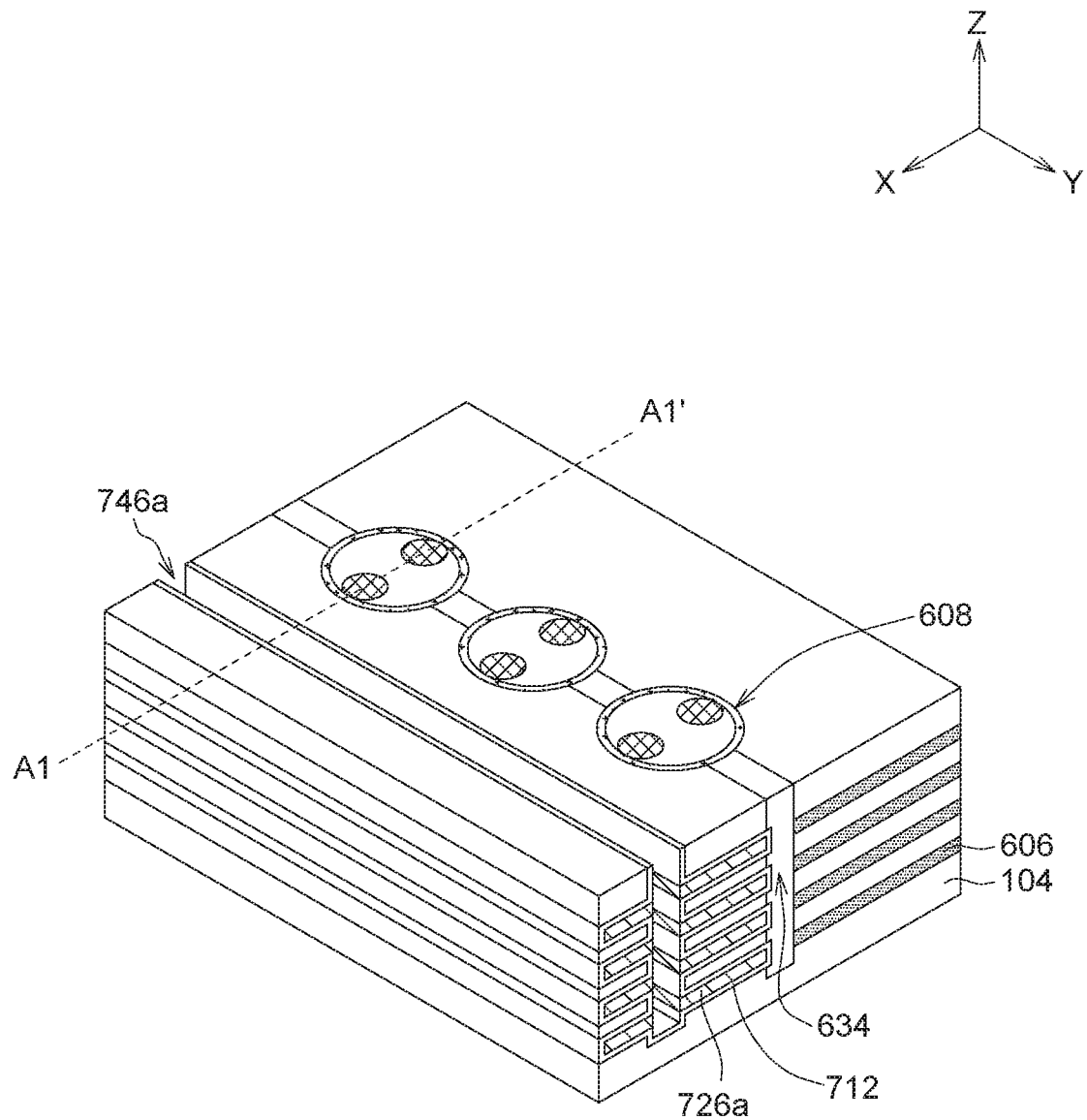
Figure 17B:
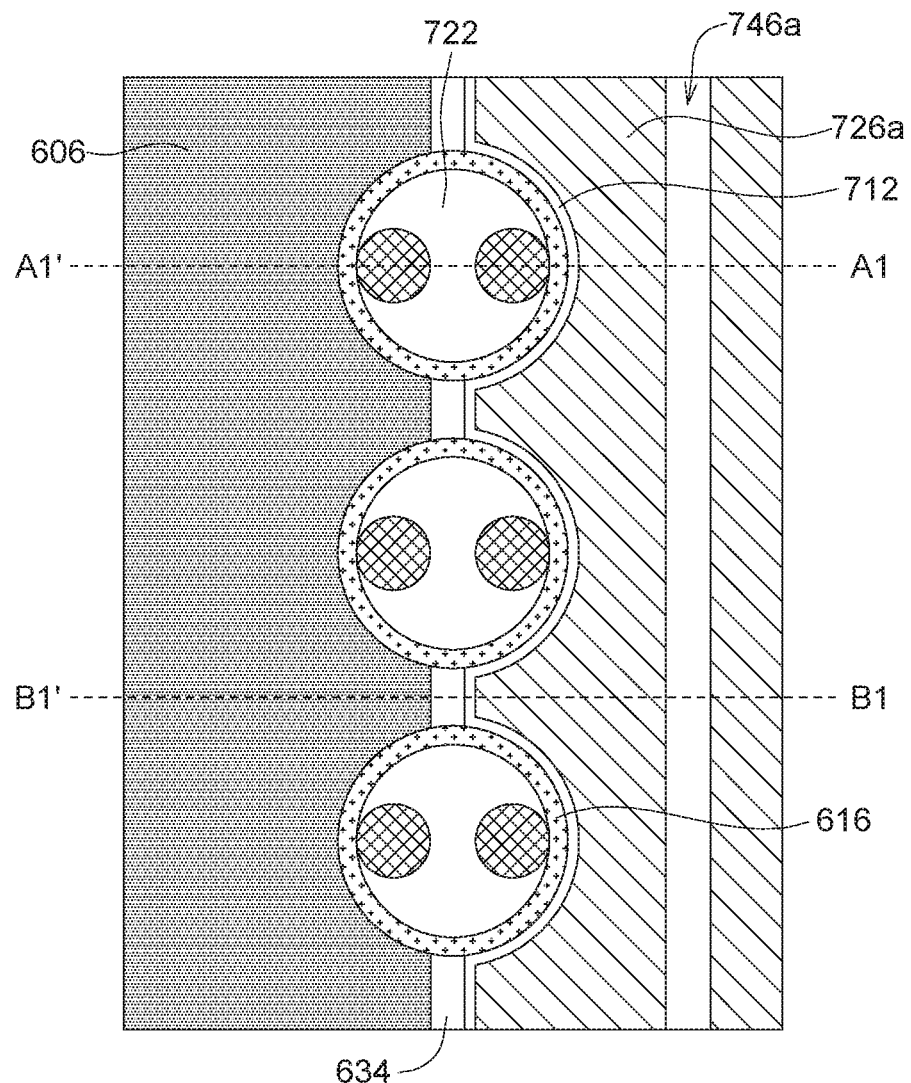
Figure 17C:
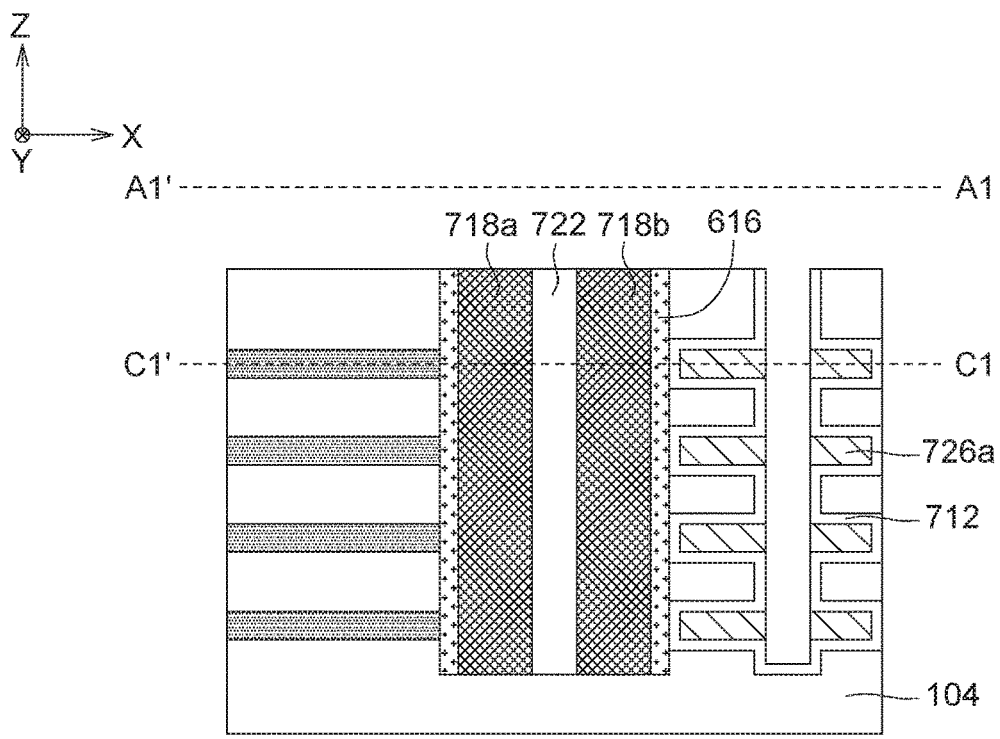
Figure 17D:
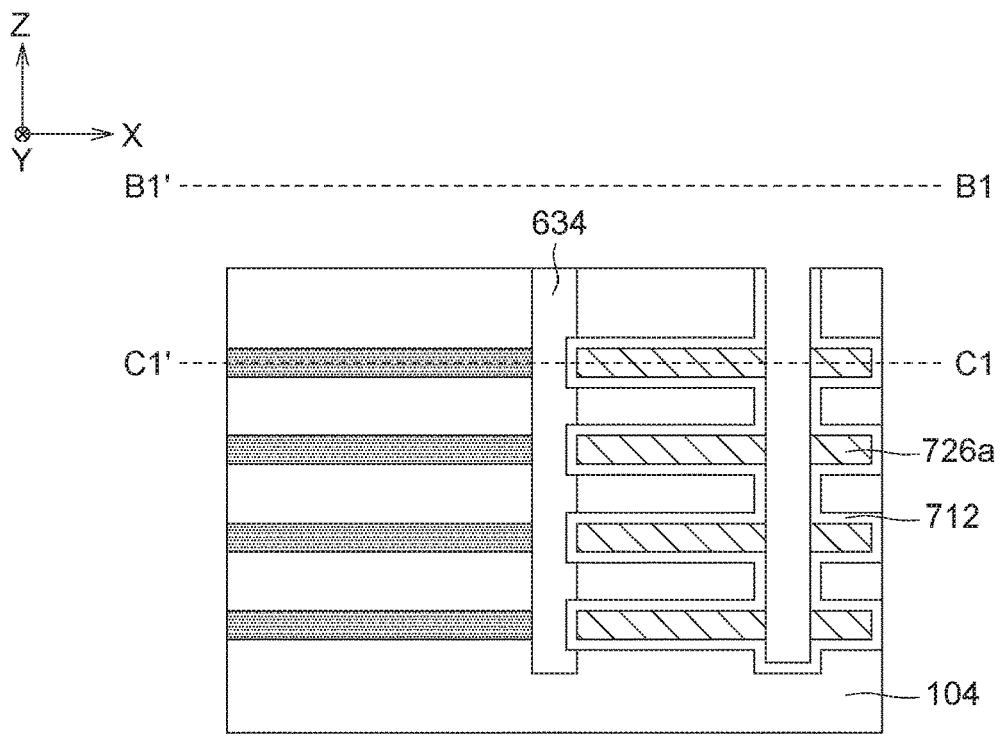

Next, referring to FIGS. 16A to 16D, portions of the insulating layers 104 are removed through the first lateral openings 104p1 by a first trimming process (e.g., wet etching), to form a plurality of second lateral openings 104p2 between the remaining insulating layers 104 adjacent to the first isolation trench 746a. The first lateral openings 104p1 have a first height H1 in the first direction (e.g. Z direction) (as shown in FIG. 15C), and the second lateral openings 104p2 have a second height H2 in the first direction (e.g. Z direction) (as shown in FIG. 16C), and the second height H2 is greater than the first height H1. In addition, after the first trimming process, the isolation structure 634 corresponding to the second lateral openings 104p2 also has a reduced width W1 in the second direction (e.g. X direction), as shown in FIGS. 16B and 16D.

Referring to FIGS. 17A to 17D, an oxide material and a conductive material are sequentially filled into the second lateral openings 104p2 to form an oxide layer 712 and a first conductive layer 726a. The material of the oxide layer 712 is, for example, the same as the isolation structure 634, for example, silicon oxide (such as silicon dioxide). In detail, the oxide layer 712 surrounds a side of the channel layer 616 adjacent to the first isolation trench 646a, and continuously extends on the same side of the isolation structure 634 and the channel layer 616 (for example, the right side in FIG. 17B).

Next, referring to FIGS. 18A to 18D, a second isolation trench 746b is formed on one side of the channel layer 616 opposite to the first isolation trench 746a, and the extending direction of the second isolation trench 746b is parallel to the extending direction of the first isolation trench 746a. After that, the remaining sacrificial layers 606 are removed through the second isolation trench 746b by a selective etching process, that is, the sacrificial layers 606 disposed on the side of the isolation structure 634 adjacent to the second isolation trench 746b are removed, to form a plurality of third lateral openings 104p3 between the remaining insulating layers 104 adjacent to the second isolation trench 746b (i.e., the positions where the sacrificial layers 606 are removed).

Next, referring to FIGS. 19A to 19D, portions of the insulating layers 104 are removed through the third lateral openings 104p3 by a second trimming process (e.g., wet etching), to form a plurality of fourth lateral openings 104p4 between the remaining insulating layers 104 adjacent to the second isolation trench 746b (that is, the s where the sacrificial layers 606 are removed). The third lateral openings 104p3 have a third height H3 in the first direction (e.g. Z direction) (as shown in FIG. 18C), and the fourth lateral openings 104p4 have a fourth height H4 in the first direction (e.g. Z direction) (as shown in FIG. 19C) The fourth height H4 is greater than the third height H3. In addition, after the second trimming process, the isolation structure 634 corresponding to the fourth lateral openings 104p4 also has a reduced width W2 in the second direction (e.g. X direction), as shown in FIGS. 19B and 19D.

Referring to FIGS. 20A-20D, the fourth lateral openings 104p4 are filled with the memory material and the conductive material in sequence, to form the memory structure 732 and the second conductive layer 726b. The material of the first conductive layer 726a and the second conductive layer 726b is, for example, polysilicon, amorphous silicon, tungsten (W), cobalt (Co), aluminum (Al), tungsten silicide (WSi$_x$), or cobalt silicide (CoSi$_x$). In detail, the memory structure 732 surrounds a side of the channel layer 616 close to the second isolation trench 746b, and continuously extends on the same side of the isolation structure 634 and the channel layer 616 (for example, the left side in FIG. 20B).

In the present embodiment, one conductive layer in the stack of semiconductor device 700 includes a first conductive layer 726a and a second conductive layer 726b. Two transistors (also called 2T) can be formed at each crossing position of the first conductive layer 726a, the second conductive layer 726b and the memory string 702M, and these two transistors are respectively controlled by the first gate and the second gate. Further, the second conductive layer 726b may be the first gate, and the first conductive layer 726a may be the second gate. The first gate and the second gate are separated from each other by the isolation structure 634, the first gate is adjacent to the first position where the first conductive pollar 718a is coupled, and the second gate is adjacent to the second position where the second conductive pillar 718b is coupled. Moreover, the first gate corresponds to the memory structure 732, and used as a memory gate; the second gate corresponds to the oxide layer 712, and used as a selection gate. The oxide layer 712 is disposed between the channel layer 616 and the second gate (for example, the first conductive layer 726a), and the memory structure 732 is disposed between the channel layer 616 and the first gate (for example, the second conductive layer 726b). The oxide layer 712 extends between the channel layer 616 and the second gate, and between the isolation structure 634 and the second gate; the memory structure 732 extends between the isolation structure 634 and the first gate, and between the channel layer 616 and the first gate.

In some embodiments, portions of the isolation structure 634 corresponding to the insulating layers 104 above the second conductive layer 726b (that is, the first gate) and the first conductive layer 726a (that is, the second gate) have a first width WA in the second direction (for example, the X direction), and portions of the isolation structure 634 corresponding to the second conductive layer 726b (that is, the first gate) and the first conductive layer 726a (that is, the second gate) have a second width WB in the second direction (for example, the X direction), the first width WA is greater than the second width WB, as shown in FIG. 20D.

In some embodiments, the height H2 of the second lateral etching opening 104p2 in the first direction (e.g., Z direction) may be the same as the height H4 of the fourth lateral etching opening 104p4 in the first direction (e.g., Z direction), as shown in FIG. 20D, but the invention is not limited thereto.

In some embodiments, the height H2 of the second lateral etching opening 104p2 in the first direction (e.g., Z direction) may be smaller than the height H4 of the fourth lateral etching opening 104p4 in the first direction (e.g., Z direction) For example, a thickness of the memory structure 732 may be greater than a thickness of the oxide layer 712, as shown in FIG. 20E, but the invention is not limited thereto.

Compared with the semiconductor device 600, the first gate and the second gate of the semiconductor device 700 have a smaller space sp1 (as shown in FIG. 20B), for example, 10 nm or 20 nm. Therefore, it can have a better read current, and source-side injection programming can be faster. The space sp1 is, for example, equal to the sum of the widths of the isolation structure 634, the oxide layer 712, and the memory structure 732 in the second direction (for example, the X direction).

Figure 21:
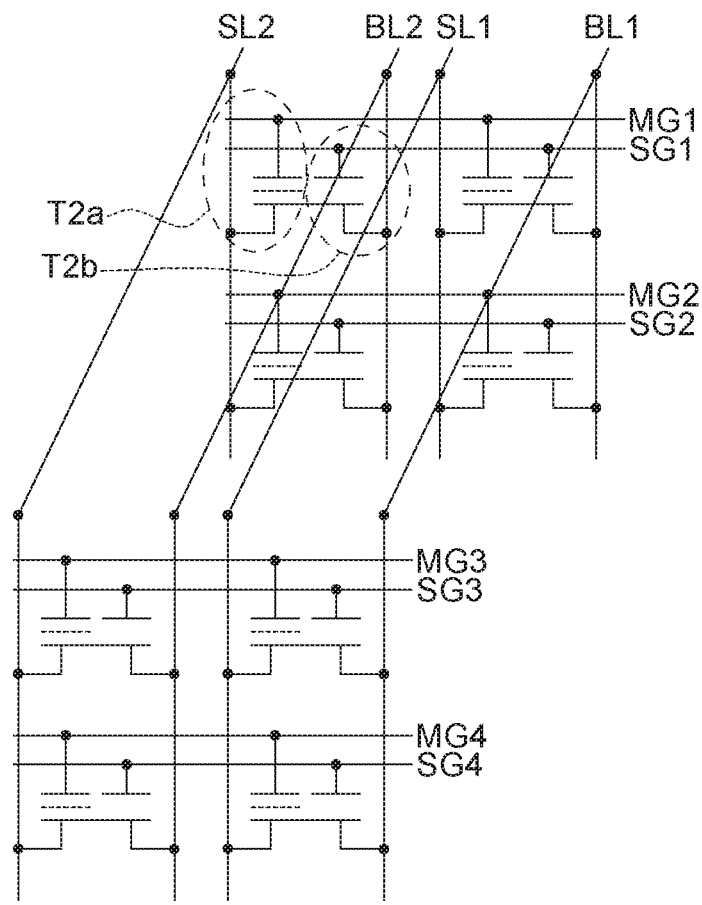
FIG. 21 is a circuit diagram of a semiconductor device according to another embodiment of the present invention.

FIG. 21 is a circuit diagram of a semiconductor device 600 or 700 according to further embodiment of the present invention.

Referring to FIG. 21, the intersections of the first conductive layers (626a or 726a), the second conductive layers (626b or 726b) and the memory strings (602M or 702M) can form two connected transistors (for example, the first transistor T2a and the second transistor T2b), so the semiconductor device 600 or 700 of the present embodiment may also be referred to as a 2T memory device. The first transistor T2a corresponds to, for example, the memory structure 632 or 732; the second transistor T2b corresponds to, for example, the oxide layer 612 or 712. The first conductive layer (626a or 726a) can be used as the selection gates SG1 to SG4, and the second conductive layer (626b or 726b) can be used as the memory gates MG1 to MG4. The source lines SL1 and SL2 may be coupled to the first conductive pillar (618a or 718a), and the bit lines BL1 and BL2 may be coupled to the second conductive pillar (618b or 718b). In one embodiment, the first transistor T2a and the second transistor T2b may be controlled by a first gate (for example, the memory gate MG1) and a second gate (for example, the selection gate SG1), respectively.

In comparison with the embodiment of the 1.5T semiconductor device, since the present embodiment is a 2T semiconductor device, the transistor can be controlled more accurately. For example, the first gate and the second gate can be given different voltages respectively, and the present invention is not limited to this, and may be adjusted according to requirements.

In some embodiments, the present invention provides an AND flash memory device including a semiconductor device 100 to 600 or 700.

In some embodiments, the present invention provides a 1.5T memory device including a semiconductor device 100-400 or 500.

In some embodiments, the present invention provides a 2T memory device including a semiconductor device 600 or 700.

Figure 22:
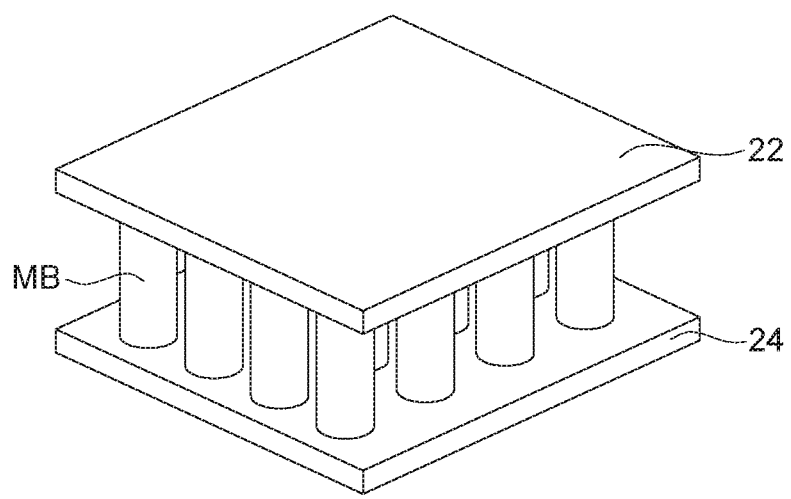
FIG. 22 is a schematic diagram of a package structure according to an embodiment of the present invention.

FIG. 22 is a schematic diagram of a package structure 20 according to an embodiment of the present invention.

Referring to FIG. 22, the package structure 20 includes a memory chip 22 and a memory control chip 24. The memory chip 22 is disposed on the memory control chip 24 along a first direction (for example, Z direction). The memory chip 22 and the memory control chip 24 may be connected by through silicon vias (TSVs) (not shown), bumps MB, or other suitable components. In the present embodiment, the material of the bumps MB may include copper, but the present invention is not limited thereto. The memory chip 22 may include any one of the semiconductor devices 100 to 700 described in this application or an arbitrary combination thereof. In some embodiments, the memory chip 22 may include an AND flash memory device, a NOR memory device, or other suitable memory devices. The memory control chip 24 can be used to control the memory chip 22. The memory control chip 24 may include logic circuits, row decoders, column decoders, or other suitable components.

In comparison with a comparison example in which a row decoder and a column decoder are disposed in a horizontal arrangement with a memory chip (that is, the row decoder and the column decoder are not disposed below the memory chip), or a comparison example of an embedded flash memory, the memory chip 22 of the present embodiment can be vertically stacked on the memory control chip 24 including a row decoder, a column decoder, and a logic circuit, and fewer pads can be used. It can save cost and simplify manufacturing, and can have a smaller size, can form a high-density memory strings, and can consume less energy when performing a write operation.

According to an embodiment of the invention, the semiconductor device includes a stack and a plurality of memory strings. The stack is formed on a substrate, and the stack includes a plurality of conductive layers and a plurality of insulating layers alternately stacked with the conductive layers. The memory strings penetrate the stack along a first direction, and each of the memory strings includes a channel layer, a memory structure, a first conductive pillar and a second conductive pillar. The channel layer extends along a first direction. The memory structure is disposed between the stack and the channel layer. The first conductive pillar and the second conductive pillar extend along the first direction and are electrically isolated from each other, and are respectively coupled to a first location and a second location of the channel layer. The first location is opposite to the second location. The memory structure surrounds the first location and exposes the second location.

In comparison with the comparative example in which the memory structure surrounds the first conductive pillar and the second conductive pillar, the memory structure of one embodiment of the present invention surrounds the first location and exposes the second location. The second location is surrounded by the oxide layer and is not surrounded by the memory structure, so the problem of over erasing can be avoided, the current leakage of the drain of the transistor or the bit line can be prevented, and further a low read voltage can be used during operation.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a stack formed on a substrate, the stack including a plurality of conductive layers and a plurality of insulating layers alternately stacked with the conductive layers; and
a plurality of memory strings penetrating the stack along a first direction, and each of the memory strings having a first side and a second side opposite to each other along a second direction perpendicular to the first direction, and comprising
a channel layer extending along the first direction;
a memory structure disposed between the stack and the channel layer on the first side; and
a first conductive pillar and a second conductive pillar extending along the first direction and electrically isolated from each other, and respectively coupled to a first portion and a second portion of the channel layer, and the first portion is opposite to the second portion along the second direction, wherein the memory structure extends along an outer surface of the channel layer to surround the first portion on the first side and stops extending to the second portion on the second side.

2. The semiconductor device according to claim 1, wherein:
the channel layer has an annular cross section along the second direction and a third direction, the second direction and the third direction are perpendicular to the first direction, the channel layer has an annular inner surface, the first conductive pillar and the second conductive pillar are coupled to the annular inner surface.

3. The semiconductor device according to claim 1, wherein each of the memory strings comprises an insulating pillar disposed in a central area.

4. The semiconductor device according to claim 3, wherein the first conductive pillar and the second conductive pillar are connected to the insulating pillar.

5. The semiconductor device according to claim 1, further comprising:
a plurality of input lines, one of the input lines is coupled to the first conductive pillar; and
a plurality of output lines, one of the output lines is coupled to the second conductive pillar.

6. The semiconductor device according to claim 5, wherein the input lines and the output lines are parallel to each other and extend along the second direction.

7. The semiconductor device according to claim 1, further comprising a plurality of isolation trenches dividing the stack into a plurality of sub-stacks, wherein each of the isolation trenches extends in a direction perpendicular to an extending direction of a connection line between the first conductive pillar and the second conductive pillar.

8. The semiconductor device according to claim 1, further comprising a plurality of isolation trenches dividing the stack into a plurality of sub-stacks, wherein each of the isolation trenches extends in a direction parallel to an extending direction of a connection line between the first conductive pillar and the second conductive pillar.

9. The semiconductor device according to claim 1, wherein the memory structure comprises a charge storage material.

10. The semiconductor device according to claim 1, wherein the memory structure includes a ferroelectric material.

11. The semiconductor device according to claim 1, wherein each of the memory strings has an oval cross section.

12. The semiconductor device according to claim 1, wherein at least one conductive layer of the conductive layers comprises a first gate and a second gate, the first gate and the second gate are separated from each other by an isolation structure, the first gate corresponds to the first portion, and the second gate corresponds to the second-portion.

13. The semiconductor device according to claim 12, wherein the first gate is used as a memory gate and the second gate is used as a selection gate.

14. The semiconductor device according to claim 12, further comprising an oxide layer, wherein the oxide layer is disposed between the channel layer and the second gate, and the memory structure is disposed between the channel layer and the first gate.

15. The semiconductor device according to claim 14, wherein the oxide layer extends between the channel layer and the second gate, and between the isolation structure and the second gate; the memory structure extends between the isolation structure and the first gate, and between the channel layer and the first gate.

16. The semiconductor device according to claim 12, wherein portions of the isolation structure corresponding to the insulating layers above the first gate and the second gate have a first width along the second direction; portions of the isolation structure correspond to the first gate and the second gate have a second width along the second direction, the first width is greater than the second width.

17. An array layout of a semiconductor device, comprising:
   a stack formed on a substrate, the stack including a plurality of conductive layers and a plurality of insulating layers alternately stacked with the conductive layers; and
   a plurality of memory strings penetrating the stack along a first direction and disposed on the substrate as a memory array along a second direction and a third direction, wherein the first direction, the second direction and the third direction are perpendicular to each other, each of the memory strings has a first side and a second side opposite to each other along the second direction and comprises:
   a channel layer extending along the first direction;
   a memory structure disposed between the stack and the channel layer on the first side; and
   a first conductive pillar and a second conductive pillar extending along the first direction and electrically isolated from each other, and respectively coupled to a first portion and a second portion of the channel layer, and the first portion is opposite to the second portion along the second direction, wherein the memory structure extends along an outer surface of the channel layer to surround the first portion on the first side and stops extending to the second portion on the second side,
   the memory strings are disposed into a plurality of rows of the memory strings along the third direction in the memory array, and adjacent rows of the memory strings have an offset distance in the third direction,
   wherein a plurality of the first portions of the adjacent rows of the memory strings are adjacent to each other.

18. The array layout of the semiconductor device according to claim 17, further comprising:
   a plurality of conductive patterns electrically connected to one of the first conductive pillar and the second conductive pillar;
   a plurality of input lines extending along the second direction, wherein each of the input lines is coupled to the first conductive pillar that corresponds through a first via; and
   a plurality of output lines extending along the second direction, wherein each of the output lines is coupled to the second conductive pillar that corresponds through a second via.

19. A package structure, comprising:
   a memory chip comprising the semiconductor device according to claim 1; and
   a memory control chip for controlling the memory chip,
   wherein the memory chip is disposed on the memory control chip.

* * * * *